United States Patent
Salmon

(10) Patent No.: US 10,689,754 B2
(45) Date of Patent: Jun. 23, 2020

(54) PROGRAMMABLE CHARGE STORAGE ARRAYS AND ASSOCIATED MANUFACTURING DEVICES AND SYSTEMS

(71) Applicant: Peter C. Salmon, Mountain View, CA (US)

(72) Inventor: Peter C. Salmon, Mountain View, CA (US)

(73) Assignee: Peter C. Salmon, Mountain View, CA (US)

( * ) Notice: Subject to any disclaimer, the term of this patent is extended or adjusted under 35 U.S.C. 154(b) by 0 days.

(21) Appl. No.: 16/387,144

(22) Filed: Apr. 17, 2019

(65) Prior Publication Data

US 2019/0252017 A1    Aug. 15, 2019

Related U.S. Application Data

(63) Continuation-in-part of application No. 15/695,697, filed on Sep. 5, 2017, now Pat. No. 10,312,319.

(51) Int. Cl.
*C23C 16/04* (2006.01)
*G11C 11/24* (2006.01)
(Continued)

(52) U.S. Cl.
CPC ............ *C23C 16/047* (2013.01); *G11C 11/24* (2013.01); *H01L 21/707* (2013.01); *H01L 27/016* (2013.01); *B41M 1/125* (2013.01); *G03G 13/02* (2013.01); *G03G 15/02* (2013.01); *H01L 21/02244* (2013.01); *H01L 21/02266* (2013.01); *H01L 21/02271* (2013.01); *H01L 21/02282* (2013.01); *H01L 21/32133* (2013.01); *H01L 27/1218* (2013.01)

(58) Field of Classification Search
CPC ..... G11C 11/24; H01L 21/707; H01L 27/016; H01L 21/02244; H01L 21/02266; H01L 21/02271; H01L 21/02282; H01L 21/32133; H01L 27/1218; B41M 1/125; G03G 13/05; G03G 13/02; G03G 13/045; G03G 15/00; G11B 9/08; C23C 16/04
See application file for complete search history.

(56) References Cited

U.S. PATENT DOCUMENTS 3,504,625 A * 4/1970 Childress ............... B41M 1/125
                                                                                    101/129
3,531,646 A * 9/1970 Kazan .................. G04B 21/027
                                                                                    430/97

(Continued)

OTHER PUBLICATIONS

U.S. Appl. No. 15/695,697, "Notice of Allowance", dated Jan. 17, 2019, 10 pages.

(Continued)

*Primary Examiner* — Scott B Geyer
(74) *Attorney, Agent, or Firm* — Kilpatrick Townsend & Stockton LLP

(57) ABSTRACT

A charge storage cell includes a substrate having a back side conductive layer or conductive element, a top side metal pad coupled to the substrate, and an insulating layer formed on the metal pad. The metal pad will support an electric charge injected through the insulating layer by a charged particle beam. A regular array of charge storage cells provides a charge storage array.

15 Claims, 23 Drawing Sheets

(51) Int. Cl.
  *H01L 27/01* (2006.01)
  *H01L 21/70* (2006.01)
  *H01L 27/12* (2006.01)
  *H01L 21/3213* (2006.01)
  *H01L 21/02* (2006.01)
  *B41M 1/12* (2006.01)
  *G03G 13/02* (2006.01)
  *G03G 15/02* (2006.01)

(56) References Cited

U.S. PATENT DOCUMENTS

| | | | | |
|---|---|---|---|---|
| 3,615,383 A * | 10/1971 | Inoue | ................... | G03G 13/045 |
| | | | | 430/54 |
| 3,638,566 A * | 2/1972 | Greenly | ................... | B41F 15/00 |
| | | | | 101/114 |
| 3,830,645 A * | 8/1974 | Zweig | ................... | G03G 15/227 |
| | | | | 430/48 |
| 3,852,801 A * | 12/1974 | Itoh | ................... | H01L 27/148 |
| | | | | 257/235 |
| 4,299,450 A | 11/1981 | Funada et al. | | |
| 4,407,918 A * | 10/1983 | Sato | ................... | G03G 5/0436 |
| | | | | 399/136 |
| 4,626,920 A | 12/1986 | Glenn | | |
| 4,628,017 A * | 12/1986 | Tagoku | ................... | G03G 15/05 |
| | | | | 399/130 |
| 4,800,526 A * | 1/1989 | Lewis | ................... | G03G 15/221 |
| | | | | 365/118 |
| 5,135,630 A | 8/1992 | Goldburt et al. | | |
| 5,161,233 A * | 11/1992 | Matsuo | ................... | G03G 5/02 |
| | | | | 355/77 |
| 5,439,768 A * | 8/1995 | Matsuo | ................... | G03G 5/02 |
| | | | | 386/E5.055 |
| 5,497,179 A * | 3/1996 | Aono | ................... | G03G 5/02 |
| | | | | 347/112 |
| 5,527,650 A * | 6/1996 | Yoshinaga | ................... | G03G 15/18 |
| | | | | 430/20 |
| 6,649,221 B1 | 11/2003 | Tateno et al. | | |
| 7,054,054 B1 | 5/2006 | Srinivasan et al. | | |
| 8,937,001 B2 | 1/2015 | Jacobson et al. | | |
| 2004/0033679 A1 | 2/2004 | Jacobson et al. | | |
| 2004/0217294 A1* | 11/2004 | Zur | ................... | G01T 1/2018 |
| | | | | 250/370.09 |
| 2007/0024272 A1* | 2/2007 | Zentai | ................... | G01R 31/2812 |
| | | | | 324/763.01 |
| 2007/0194310 A1* | 8/2007 | Demars | ................... | G01R 31/305 |
| | | | | 257/48 |
| 2016/0079060 A1 | 3/2016 | Jacobson et al. | | |

OTHER PUBLICATIONS

U.S. Appl. No. 15/695,697, "Restriction Requirement", dated Oct. 10, 2018, 7 pages.

\* cited by examiner

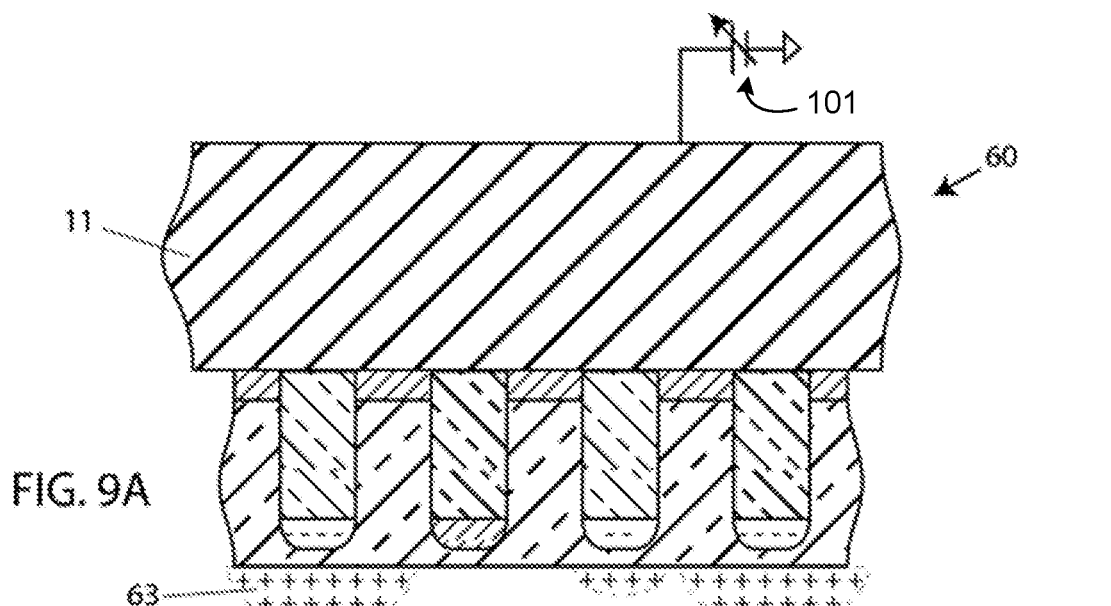
FIG. 9A
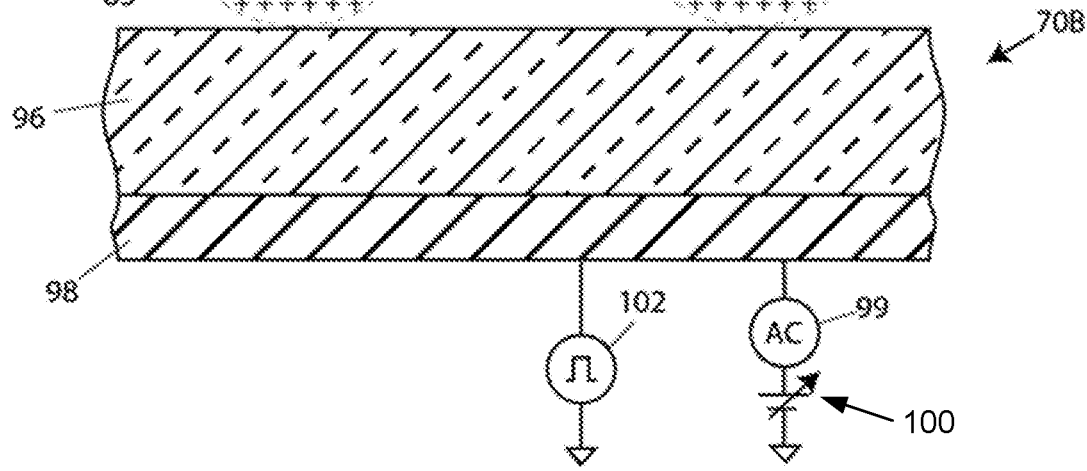
FIG. 9B
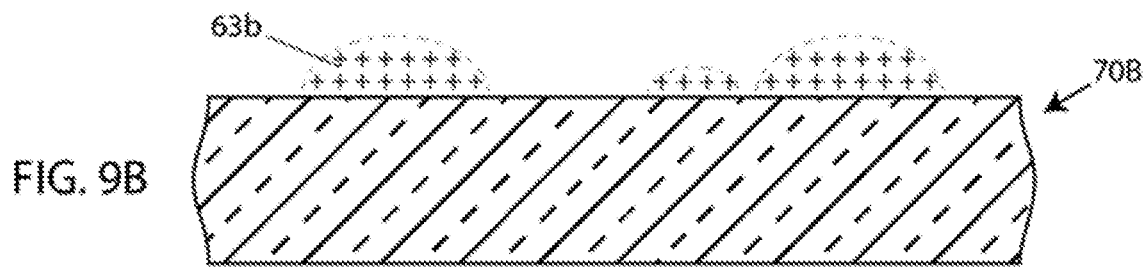
FIG. 9C
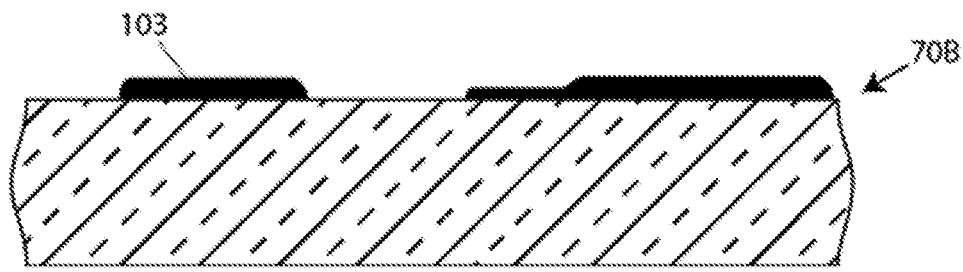

2300

2301
providing a substrate comprising an insulating material and having a metallic coating on each of the bottom side and the top side of the substrate;

2302
patterning the metallic coating on the top side to form a regular array of metal pads;

2303
providing an insulating layer around exposed portions of each metal pad in the regular array of metal pads; and, 2304
charging selected ones of the metal pads using a modulated particle beam, the selected ones corresponding to a pre-determined charge pattern for a charge storage array comprising the regular array of metal pads, wherein a pre-determined charging current is used to create a desired level of electrical charge in each of the selected ones of the metal pads.

FIG. 23

PROGRAMMABLE CHARGE STORAGE ARRAYS AND ASSOCIATED MANUFACTURING DEVICES AND SYSTEMS

CROSS-REFERENCES TO RELATED APPLICATIONS

The present application is a continuation-in-part of U.S. patent application Ser. No. 15/695,697, filed on Sep. 5, 2017, the disclosure of which is hereby incorporated by reference in its entirety for all purposes.

BACKGROUND OF THE INVENTION

Flash memory cells have been developed. They typically have a floating gate whose electrical charge can be programmed to represent a digital one or zero, by the action of a tunneling current through a thin gate oxide. The typical substrate is silicon, which can tolerate high temperature processing for creation of the gate oxide. The flash memory cells are unsuitable for directly implementing a charge image comprising an array larger than 100×100 cells, because transfer gates and bit-line contacts would interrupt the otherwise regular array of memory cells.

Methods have been developed for atomic and molecular layer deposition. These methods enable precise synthesis of new materials, and the new materials can lead to new products and applications of great potential value. However, the products produced by molecular layer deposition generally have a small size, viewable through an electron microscope for example, and this limits their commercial application.

Despite the progress made in memory cell fabrication, there is a need in the art for uninterrupted charge storage arrays that can be fabricated at low temperatures, manufacturable on flexible polymer substrates or metal foil substrates for example. There is a further need in the art for manufacturing systems that can implement processes related to molecular layer deposition, wherein the new processes provide a large area format that can be fabricated at high speed.

SUMMARY OF THE INVENTION

The present invention relates generally to charge storage arrays, and manufacturing systems pertaining thereto. More particularly, embodiments provide methods and systems for fabricating charge storage cells on a flexible substrate, wherein the charge storage cells comprise an uninterrupted two-dimensional array. Embodiments of the present invention include patterning webs, deposition modules, and roll-to-roll manufacturing systems, all of which may utilize embodiments of the proposed charge storage arrays.

When the charge storage arrays are used for patterning deposition materials on a substrate, the pattern for each deposition layer is electronically definable by writing to a charge storage array embedded in the manufacturing device or system. A charge storage array of the present invention may also be configured and used as a memory device.

According to an embodiment of the present invention, a charge storage cell is provided. The charge storage cell includes a conductive substrate, a vertical post comprising a first insulating material coupled to the conductive substrate, and a conductive cap coupled to the vertical post. The charge storage cell also includes a top side planarizing layer comprising a second insulating material and covering the conductive cap. The conductive cap will support an electric charge injected through the top side planarizing layer by a modulated charged particle beam.

According to another embodiment of the present invention, a method of storing charge in a predetermined pattern is provided. The method includes providing a substrate including a plurality of charge storage cells. Each of the plurality of charge storage cells includes a first insulating material, a conductive pad coupled to the first insulating material, and a planarizing layer comprising a second insulating material and encapsulating the conductive pad. The conductive pad can include a metal seed layer and a plated-up metal layer. The method also includes injecting a first electric charge onto a first conductive pad through the planarizing layer. The first conductive pad is associated with a first charge storage cell. The method further includes injecting a second electric charge different from the first electric charge onto a second conductive pad through the planarizing layer. The second conductive pad is associated with a second charge storage cell.

According to a specific embodiment of the present invention, a patterning substrate is provided. The patterning substrate includes a substrate having a back surface and a front surface opposing the back surface and a two-dimensional array of electrical charge storage cells coupled to the front surface of the substrate. Each of the electrical charge storage cells includes a conductive pad disposed in a first plane positioned at a first distance from the back surface and operable to support an electric charge and a planarizing layer of insulating material encapsulating the conductive pad. A top surface of the planarizing layer is disposed in a second plane positioned at a second distance from the back surface greater than the first distance. The top surface of the planarizing layer is operable to receive a deposition material. The deposition material can include one or more molecules, which can carry an electric charge or be electrically polar. Each of the electrical charge storage cells is characterized by an electric field extending from the first plane through the top surface of the planarizing layer in response to the electric charge supported by the conductive pad of each electrical charge storage cell.

As an example, the injection of charged entities is achievable using a particle beam. For example, the particle beam can include positively charged entities or negatively charged entities.

According to an embodiment of the present invention, a charge storage array is provided. The charge storage array includes a plurality of charge storage cells. Each of the plurality of charge storage cells includes a metal pad enclosed within insulating material. Each of the plurality of charge storage cells is programmable by injecting electric charge onto the metal pad, for example, using a predetermined current level and duration of a particle beam, which can be varied as a function of position to define a two-dimensional pattern.

As an example, the amount of electric charge injected onto the metal pad of each charge storage cell is predetermined and variable, creating a programmable charge storage array having multiple levels of charge stored in each cell of the charge storage array. The array configuration of charge storage cells can include an uninterrupted two-dimensional array extending over greater than 100×100 charge storage cells without a select gate and without a bit-line contact positioned between any of the charge storage cells making up the uninterrupted two-dimensional array.

According to another embodiment of the present invention, a patterning substrate is provided. The patterning substrate includes a substrate having a backside and including a plurality of electrical charge storage cells disposed in an array configuration on the topside opposite the backside. Each of the plurality of electrical charge storage cells includes a charge storage layer disposed in a first plane positioned at a first distance from the backside and an insulating layer disposed in a second plane positioned at a second distance from the backside greater than the first distance. The insulating layer has a bottom surface coupled to the charge storage layer and a top surface opposite the bottom surface configured to receive a deposition material. Each of the plurality of electrical charge storage cells is programmable to create a predetermined electric field extending from the charge storage layer through the top surface of the insulating layer. As an example, the array configuration of electrical charge storage cells can define a uniformly periodic (e.g., an uninterrupted) two-dimensional array extending over greater than 100×100 electrical charge storage cells without a select gate and without a bit-line contact disposed between any of the electrical charge storage cells making up the uninterrupted two-dimensional array.

As an example, selected ones of the plurality of electrical charge storage cells can include embedded electrical charges, in accordance with a charge image that corresponds with a desired patterning of the deposition material. Moreover, the patterning substrate can further include at least one circumferentially arrayed electrical charge storage feature, peripherally surrounding the plurality of electrical charge storage cells and configurable as an alignment feature.

According to a particular embodiment of the present invention, a deposition module is provided. The deposition module includes a patterning web fabricated on a flexible substrate, a programmable charge array embedded in the pattering web, a source of deposition material, a transfer electrode, and a target substrate. A desired pattern of the deposition material is programmed into the programmable charge array. Accordingly, the deposition material is accumulated on the patterning web in accordance with the desired pattern and the accumulated material is transferred to the target substrate at the transfer electrode in accordance with the desired pattern.

In some embodiments, the deposition module further includes a finishing station that is operable to process the material transferred to the target substrate by applying as non-limiting examples, heat, a radiated beam, a chemical process, a coating process, a passivating process, a charging or discharging process, a physical process, or combinations thereof. The deposition module can be operated in ambient air. Alternatively, the deposition module can include a first enclosing chamber that is operable to maintain a gas environment other than air inside the first enclosing chamber, for example, a controlled environment. The deposition module in this case can also include a second enclosing chamber positioned outside of the first enclosing chamber so that the deposition module is operable to maintain a vacuum inside the second enclosing chamber. In a particular embodiment, the deposition module further includes a vacuum chamber such that is possible to maintain a vacuum inside the vacuum chamber.

According to a specific embodiment of the present invention, a manufacturing system is provided. The manufacturing system includes a plurality of in-line deposition modules. Each of the plurality of in-line deposition modules includes a patterning web fabricated on a flexible substrate, a programmable charge array embedded in the pattering web, a source of deposition material, a transfer electrode, and a target substrate. A desired pattern of the deposition material is programmed into each programmable charge array such that the deposition material is accumulated on the patterning web in accordance with the desired pattern. Subsequently, the accumulated material is transferred to the target substrate at the transfer electrode in accordance with the desired pattern.

As an example, the manufacturing system can include a roll-to-roll transport system operable to transport the target substrate past each of the plurality of in-line deposition modules. Moreover, the manufacturing system can be configured to produce chip attach patterns of deposited material on the target substrate using one or more of the plurality of in-line deposition modules. In this case, the manufacturing system can further include a chip attach station operable to attach semiconductor chips to corresponding ones of the chip attach patterns. In other embodiments, a singulation station is provided that is operable to singulate selected areas of the target substrate, which can be a flexible material or a rigid material. In some embodiments, the manufacturing system includes one or more vacuum chambers, with each vacuum chamber operable to maintain a vacuum in a selected number of deposition modules.

According to another specific embodiment of the present invention, a method for fabricating an array of electrically charged elements on a substrate is provided. The method includes providing a substrate having a top surface comprising a metal, coating the top surface with a first insulating material, and patterning the first insulating material to form posts on the substrate. Since these posts extend away from the surface of the substrate, they can be referred to as vertical posts. However, embodiments of the present invention do not require posts that are truly vertical in the sense that they extend only in the direction normal to the surface. Rather, the posts can extend in directions that are not completely aligned with the normal and yet still be considered as vertical. The method also includes coating the vertical posts with a deposited metal layer using anisotropic coating means, wherein the top of the vertical posts receives a thicker layer of metal than the side walls of the vertical posts. The method further includes etching the deposited metal layer to remove metal (e.g., all metal) from the side walls of the vertical posts, while retaining a metal pad at the top of each vertical post and coating the vertical posts with a planarizing layer of a second insulating material.

According to an embodiment of the present invention, an alternative method for fabricating an array of electrically charged elements on a substrate is provided. The method includes providing a flexible polymer substrate, coating the top surface of the polymer substrate with a thin film metal, and patterning the thin film metal to form isolated metal pads on the polymer substrate. The method further includes coating the isolated metal pads with a planarizing layer of insulating material.

According to another embodiment of the present invention, a method for aligning a first substrate and a second substrate is provided. The method includes providing a first substrate having a first top face, first embedded charges in the first top face configured as alignment features, and a first conductive plane. The method also includes providing a second substrate having a second top face, and second embedded charges in the second top face that positionally match the first embedded charges when the first top face and the second top face are in face-to-face relation. The second embedded charges have a charge polarity opposite the polarity of the first embedded charges.

The method further includes disposing the first top face and the second top face in face to face relation, positioning the first and second substrates in approximate alignment using a mechanical alignment system, connecting a first DC voltage to the first conductive plane, and connecting a second DC voltage in series with an AC voltage to a second conductive plane in the second substrate. Alternatively, an alignment electrode can be positioned adjacent the backside of the second substrate.

Moreover, the method includes increasing (e.g., from zero) the amplitude of the AC voltage until momentary separation of the first and second substrates is detected and holding constant the amplitude of the AC voltage for a pre-determined period, allowing the first and the second substrates to move relative to one another, once per cycle of AC voltage, such that within each cycle the first and the second substrates are momentarily decoupled with respect to adhesive forces and alignment is incrementally improved. The method further includes decreasing the amplitude of the AC voltage until a predetermined amplitude (e.g., zero amplitude) is reached, measuring the alignment accuracy between the first and second substrates, and repeating one or more of the aforementioned steps as necessary until the desired alignment accuracy has been achieved.

As an example, at least one of the first and second substrates can be held in a loosely draped manner. Accordingly, the at least one of the first and second substrates is substantially unrestricted with respect to small adjustments in position during each cycle of the AC voltage.

According to an embodiment of the present invention, a method for depositing a patterned layer of molecules on a target substrate is provided. The method includes providing a patterning substrate comprising conductive and insulating materials. At least one of the conductive materials comprises a substantially continuous metal plane in a base layer and a top surface comprises an insulating material. The method also includes providing a target substrate comprising a base layer of insulating material, providing a source of molecules that are electrically charged or electrically polar, and embedding a pattern of electrical charges in the top surface of the patterning substrate. The pattern corresponds to a desired deposition image of deposited molecules. The method further includes exposing molecules provided by the source of molecules to the top surface of the patterning substrate. The molecules are attracted to the pattern of electrical charges and form a layer of deposited molecules on the patterning substrate in accordance with the desired deposition image.

Moreover, the method includes disposing the top surface of the patterning substrate adjacent a top surface of the target substrate in face-to-face relation, disposing a transfer electrode adjacent a bottom surface of the target substrate, and applying a transfer voltage between the transfer electrode and the substantially continuous metal plane of the patterning substrate. The layer of deposited molecules is transferred from the patterning substrate to the target substrate in accordance with the desired deposition image. In some embodiments, applying the transfer voltage can include a combination of AC and/or DC voltage elements.

According to yet another embodiment of the present invention, a method for depositing a patterned layer of molecules on a target substrate is provided. The method includes providing a patterning substrate comprising conductive and insulating materials. At least one of the conductive materials comprises a substantially continuous metal plane in a base layer and a top surface comprises an insulating material. The method also includes providing a target substrate comprising a metal base layer and providing a source of molecules that are electrically charged or electrically polar. The method further includes embedding a pattern of electrical charges in a top surface of the patterning substrate. The pattern corresponds to a desired deposition image of deposited molecules.

Additionally, the method includes exposing molecules provided by the source of molecules to the top surface of the patterning substrate. The molecules are attracted to the pattern of electrical charges and form a layer of deposited molecules on the patterning substrate in accordance with the desired deposition image. The method also includes disposing the top surface of the patterning substrate adjacent a top surface of the target substrate in face-to-face relation and applying a transfer voltage between the metal base layer of the target substrate and the substantially continuous metal plane of the patterning substrate. The transfer voltage results in transfer of the layer of deposited molecules from the patterning substrate to the target substrate in accordance with the desired deposition image. The application of the transfer voltage can include a combination of AC and/or DC voltage elements.

According to another specific embodiment of the present invention, a method for fabricating a plurality of molecular layer depositions on a substrate in a roll-to-roll manner is provided. The method includes providing a target substrate, providing a plurality of in-line deposition modules, and providing a transport system for transporting the target substrate past the plurality of in-line deposition modules. The method also includes providing within each deposition module, a patterning substrate having embedded electrical charges in accordance with a desired image of deposited molecules and depositing on each patterning substrate a patterned layer of deposited molecules, in accordance with the desired image of deposited molecules. The method further includes aligning each patterning substrate with a corresponding portion of the target substrate and transferring each patterned layer of deposited molecules to its corresponding portion of the target substrate.

According to another embodiment of the present invention, a method for manufacturing an embedded charge structure is provided. The method includes providing a substrate comprising insulating material, coating the substrate with a thin film of metal, and patterning the thin film of metal to form a regular array of metal pads. The method also includes providing a planarizing layer of insulating material atop the metal pads and programming the embedded charge structure with a pre-determined charge pattern by charging selected ones of the metal pads using a modulated particle beam. The selected ones can correspond to the pre-determined charge pattern. A pre-determined programming current can be used to create a desired level of electrical charge in each metal pad.

As an example, the planarizing layer of insulating material can be provided by spinning on a dielectric material. Moreover, the pre-determined programming current can be provided by an ion implantation system. Alternatively, the pre-determined programming current can be provided by an electron beam. As described herein, the predetermined programming current traverses a thin section of the insulating layer atop the metal pads, charging the selected ones of the metal pads via tunneling.

According to an embodiment of the present invention, a charge storage structure comprises metal pads formed in a uniform periodic (i.e., uninterrupted as described herein) array on a substrate, each metal pad fully enclosed or encapsulated by insulating material. The substrate may be insulating or conductive, flexible or rigid, and may measure more than a meter in width. The array of metal pads is programmable by charging selected metal pads either positively or negatively using ion implantation or an electron beam, wherein charged entities traverse a thin layer of insulating material atop the metal pads and embed in the metal pads. The charge storage structure may be incorporated in a variety of manufacturing devices and systems, including patterning substrates, patterning webs formed in continuous loops, deposition modules, and roll-to-roll manufacturing systems. It may also be configured as a memory device. A broad range of deposition materials includes all molecules that are electrically charged or electrically polar, enabling layered organic, inorganic and biological structures.

While electronic circuits and biological structures are described herein as exemplary products that may be produced by practicing the current invention, other products may also be produced. As non-limiting examples, a painting or expression of art, a medical film, a touch screen, a battery, a solar cell, or a three-dimensional print may also be produced. Since the described methods include synthesis of new materials by stacking layers of selected molecules, many products not yet invented may be developed using the methods.

Utilizing the programmability of the charge storage array, agile production processes can be developed with short setup times, short run times, and low unit costs for both short and long production runs. Moreover, turn-around time for manufacture can also be substantially reduced using the proposed electronic programmability of the various components of a manufacturing system. The degree of process automation and the associated process yields can potentially be increased because of a unified flow of materiel among other factors. These and other embodiments of the invention along with many of its advantages and features are described in more detail in conjunction with the text below and attached figures.

According to another specific embodiment of the present invention, a charge storage cell is provided. The charge storage cell includes an insulating substrate, a bottom side metallic coating coupled to the bottom side of the substrate, and a metal pad coupled to the top side of the substrate. The charge storage cell also includes a top side insulative layer covering an otherwise exposed surface at the top of the metal pad. The metal pad will support an electric charge injected through the top side insulative layer by a modulated charged particle beam.

According to another embodiment of the present invention, a method for manufacturing an embedded charge structure is provided. The method includes providing a substrate comprising an insulating material having a metallic coating on the top side and on the bottom side of the substrate. The metallic coating on the top side is patterned to form a regular array of metal pads. The method also includes forming an insulative layer around the upper exposed surface of each metal pad (i.e. the insulative layer covers the metal pad), either by providing a blanket coating on the top side of the substrate having the isolated metal pads, or by creating an insulative layer around the upper exposed surface of each metal pad individually. The method also includes electrically charging selected ones of the metal pads using a modulated charged particle beam, the selected ones comprising a predetermined charge pattern for the regular array of metal pads. A pre-determined programming current can be used to create a desired level of electrical charge in each of the selected ones of the metal pads. The insulative layer may be formed by multiple methods including physical vapor deposition, chemical vapor deposition, thermal oxidation of the metal of the metal pad, and reaction of the material contained in the metal pad with a liquid chemical solution to form a complex functional metal-oxide film.

BRIEF DESCRIPTION OF THE DRAWINGS

FIG. 9A is a schematic cross-sectional view showing patterned molecules adhering to charged features at the surface of a patterning web, prior to transfer.

FIG. 9B is a schematic cross-sectional view of transferred molecules on the target substrate.

FIG. 9C is a cross-sectional view of the transferred molecules depicted in FIG. 9B, after a finishing step that may comprise rolling and heating.

FIG. 23 is a flow chart depicting an alternative method for fabricating an array of electrically charged elements on a substrate.

DETAILED DESCRIPTION OF SPECIFIC EMBODIMENTS

According to embodiments of the present invention, a charge storage structure is provided that includes metal or other conductive pads formed in an array pattern (e.g., an uninterrupted array) on a substrate, each metal or conductive pad enclosed on one or more sides (e.g., fully enclosed on five sides) by insulating material. For purposes of clarity, the pads fabricated from metal or other conductive materials, are referred to herein as metal pads, but this reference to metal pads is not intended to limit the scope of the present invention. The substrate may be insulating or conductive, flexible or rigid, and may measure more than a meter in width. The array of metal pads is programmable by charging selected metal pads either positively or negatively using a charged particle source (e.g., ion source, electron source, or the like), for example, using ion implantation or an electron beam, wherein charged entities traverse a layer of insulating material (e.g., a thin insulating layer) atop the metal pads, and embed in the metal pads. The charge storage structure may be incorporated in a variety of manufacturing devices and systems, including patterning substrates, patterning webs formed in continuous loops, deposition modules, and roll-to-roll manufacturing systems; it may also be configured as a memory device. A broad range of deposition materials includes all molecules that are electrically charged or electrically polar, enabling layered organic, inorganic and biological structures.

U.S. Pat. No. 9,227,220 issued on Jan. 5, 2016 describes a method for patterning materials on a substrate in which a production line may be configured in a roll-to-roll (R2R) manner.

An embodiment of the present invention employs programmable charge storage cells that have been adapted for use as patterning elements. The patterning elements correspond to pixels in an image wherein the pixel size is programmable by software, and a patterned layer of deposition material is created on a target substrate in image formation, in accordance with the charge image created by a predetermined programming of the charge storage cells.

Embodiments of the present invention enable a coarse alignment of layers using mechanical means, plus a fine alignment enabled by electrically charged features. The fine alignment can operate over short distances corresponding to individual circuits. This alignment is operable while the target substrate is either paused in a stationary position, or in motion while it is moving through the patterning process. Since coulomb forces provide a continuous restoring force, this technique for maintaining precision alignment between potentially moving substrates may be described as "active alignment" or "dynamic alignment" or "active registration."

Figure 1A:
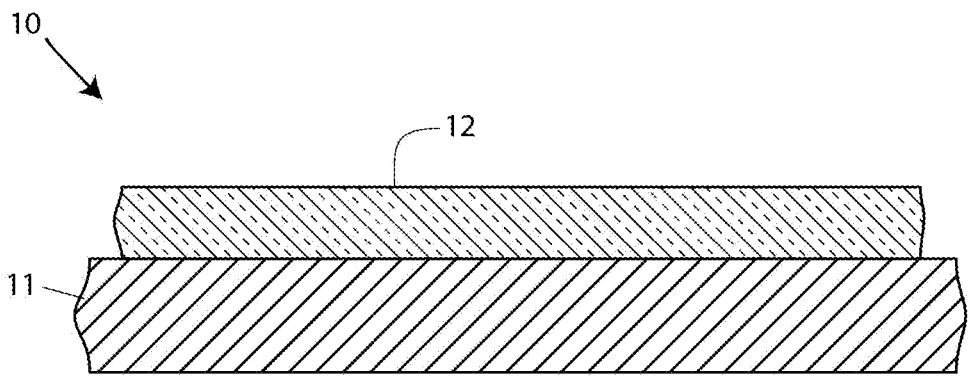
FIG. 1A is a cross-sectional view of a metal substrate coated with an insulating material.

FIGS. 1A through 1E depict an exemplary series of process steps 10 for fabricating a charge array structure according to an embodiment of the present invention. FIG. 1A shows a substrate having a conductive element at its base, for example a metal foil 11. Atop metal foil 11 is a layer 12 of insulating material, which may be spin on for example. The insulating material may comprise a polyimide, or benzocyclobutene (BCB), or a resist material that has been optimized for patterning with an electron beam as non-limiting examples. Although metal foil 11 is illustrated in FIG. 1A, embodiments of the present invention are not limited to metal materials and other conductive materials can be utilized in place of metal foil 11. One of ordinary skill in the art would recognize many variations, modifications, and alternatives.

Figure 1B:
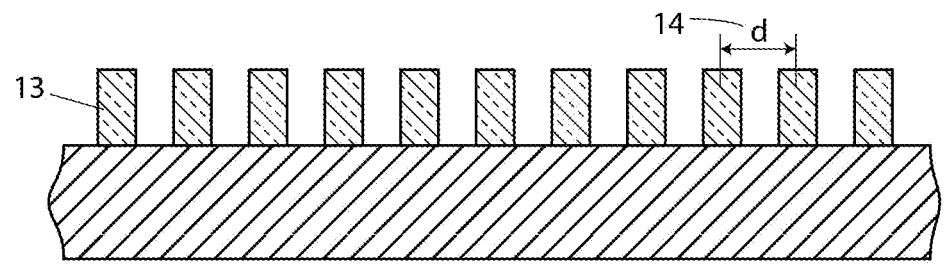
FIG. 1B is a cross-sectional view of the insulating material of FIG. 1A formed into vertical posts.

FIG. 1B shows the layer of insulating material formed into isolated insulating posts 13. Posts 13 may be formed using an e-beam for example. Since e-beam pattering of an optimized resist material is capable of fine resolutions, 10 nm features for example, the center to center distance d, 14, may be around 20 nm for example. Distance d corresponds to the diameter of a charge array cell.

Figure 1C:
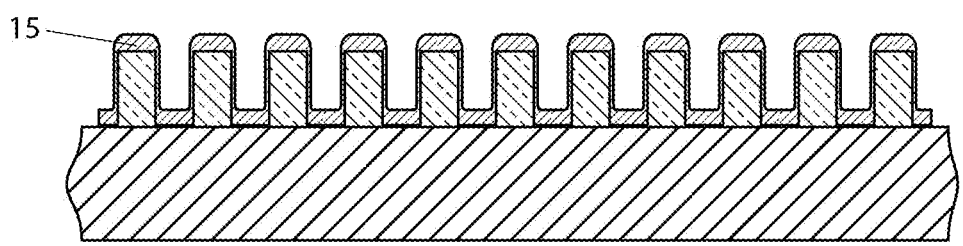
FIG. 1C is a cross-sectional view illustrating the vertical posts of FIG. 1B after applying a metal coating using an anisotropic coating process such as evaporation.

FIG. 1C illustrates the coating of a conductive material such as a thin film metal coating 15, over the insulating posts. An anisotropic coating method is preferably used, such as physical vapor deposition (PVD), known as an evaporation process. This provides a coating atop the insulating posts that is thicker than the coating on the side walls of the insulating posts, as shown in the figure.

Figure 1D:
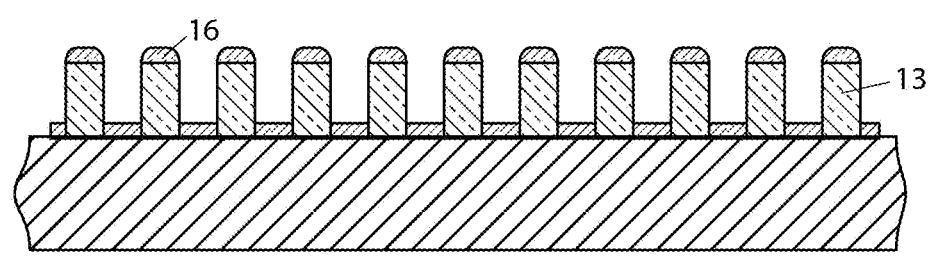
FIG. 1D is a cross-sectional view showing the result of etching the metal coating of FIG. 1C, to remove metal from the sidewalls of the vertical posts.

FIG. 1D shows the effect of etching away the thin side walls of thin film metal shown in FIG. 1C, providing an isolated metal pad 16 atop each insulating post 13.

Figure 1E:
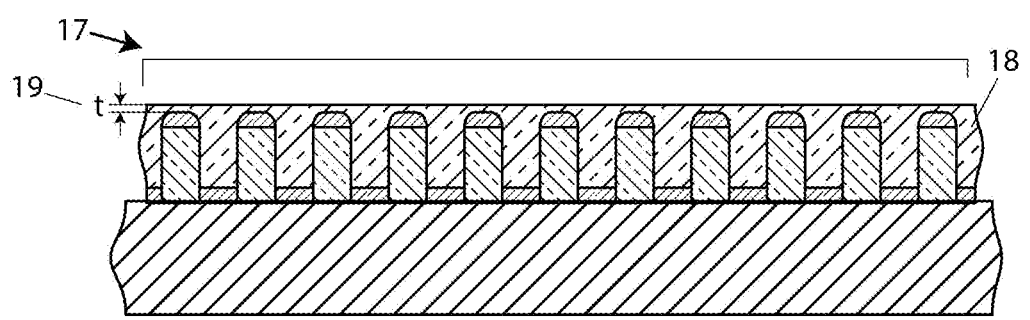
FIG. 1E is a cross-sectional view depicting the result of spinning on a planarizing layer of insulating material.

FIG. 1E depicts a portion of a completed charge storage array 17, wherein a planarizing layer 18 of insulating material is provided, creating a thin coating of insulating material atop each metal pad 16, the thin coating having a thickness t, 19. Thickness t may be in the range of 100 nm to 2 μm for example. Planarizing layer 18 may be applied as a spin-on coating for example.

Figure 2A:
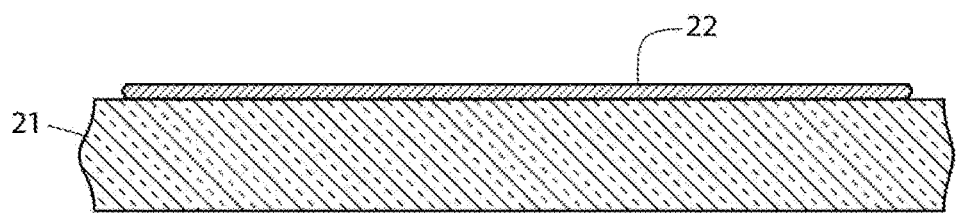
FIG. 2A is a cross-sectional view depicting the coating of an insulating substrate with a thin film metal layer.
Figure 2B:
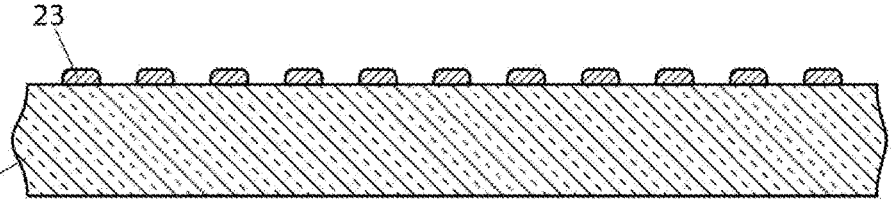
FIG. 2B is a cross-sectional view depicting the etching of the thin film metal layer of FIG. 2A to form isolated metal pads.
Figure 2C:
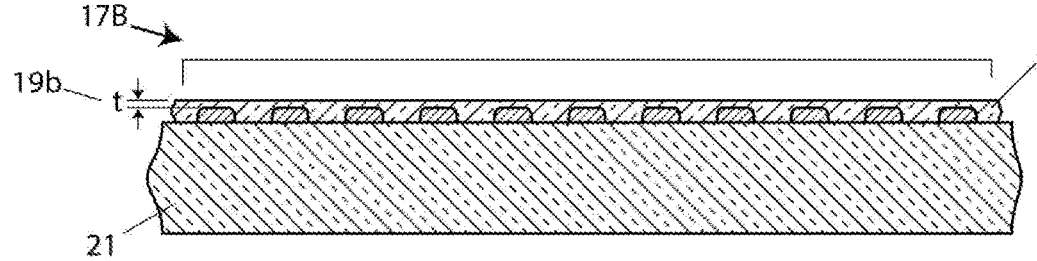
FIG. 2C is a cross-sectional view illustrating the result of spinning on a planarizing layer of insulating material.

FIGS. 2A through 2C depict an exemplary series of process steps for fabricating a charge array structure according to another embodiment of the present invention.

FIG. 2A shows an insulating substrate 21 having a conductive layer such as a layer of thin film metal 22 fabricated on top. The insulating substrate may be polyimide for example, having a thickness in the range of 100 μm to 500 μm if the substrate is to be used to fabricate a patterning web as an application example. However, the insulating substrate may also be a rigid plate (e.g., a glass plate) if the substrate is to be used to fabricate a display, as a second example that illustrates the broad range of insulating substrates that may be used in embodiments of the present invention. A glass substrate may also be used for the fabrication of a micro assay product as a further example. The deposited metal layer may be aluminum, copper, or molybdenum as non-limiting examples.

FIG. 2B illustrates the patterning of the conductive layer 22 of FIG. 2A, to form isolated metal pads 23 atop the insulating substrate 21. A wet or dry etching process may be used.

FIG. 2C depicts a portion of a completed charge storage array 17B showing the result of applying a planarizing layer 25 of insulating material to the metal pads 23 of FIG. 2B, creating a thin coating of insulating material atop each metal pad, the thin coating having a thickness t, 19b. Thickness t may be in the range of 100 nm to 2 μm for example. Planarizing layer 25 may be applied as a spin-on coating for example.

FIGS. 3A through 3D depict an exemplary series of process steps for fabricating a charge array structure according to another embodiment of the present invention.

Figure 3A:
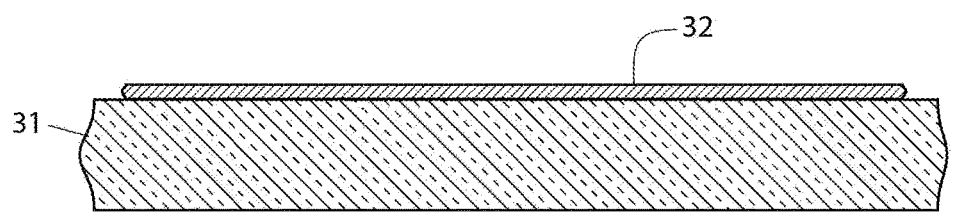
FIG. 3A is a cross-sectional view showing a thin film metal deposited on an insulating substrate.

FIG. 3A shows an insulating substrate 31 having a conductive layer such as a layer of thin film metal 32 fabricated on top. The insulating substrate may be polyimide for example, having a thickness in the range of 100 μm to 500 μm if the substrate is to be used to fabricate a patterning web as an application example. However, the insulating substrate may also be a rigid glass plate as a second example. The deposited metal layer may be aluminum, copper, or molybdenum as non-limiting examples. It is desirable to choose a metal that adheres well to the underlying insulating substrate without the need for an additional layer to promote adhesion.

Figure 3B:
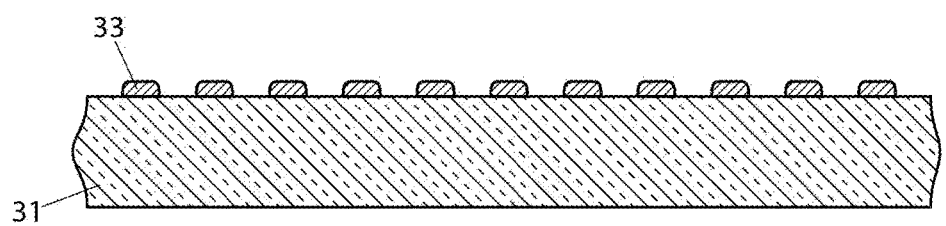
FIG. 3B is a cross-sectional view showing the result of etching the thin film metal of FIG. 3A to form isolated metal pads.

FIG. 3B illustrates the patterning of the conductive layer 32 of FIG. 3A, to form isolated metal pads 33 atop the insulating substrate 31. A wet or dry etching process may be used. The advantage of using a thin film metal layer, having a thickness of around 100 nm for example, is that it may be patterned with high resolution into metal pads, and can subsequently be plated up to achieve an increased thickness.

Figure 3C:
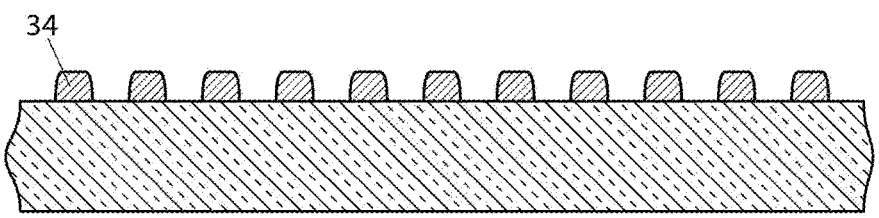
FIG. 3C is a cross-sectional view showing the result of plating up the thin film metal pads of FIG. 3B.

FIG. 3C shows the result of plating up the thin film metal pads 33 to form thicker metal pads 34 as shown. The increased thickness of pads 34 may be desirable so that if a metal pad 34 is to be charged using a beam of high energy particles, it will be thick enough to provide an effective stop to the charged particles. This has the desired effect that injected charges are all localized to the metal pad, and not distributed elsewhere in the enclosing insulating materials.

Figure 3D:
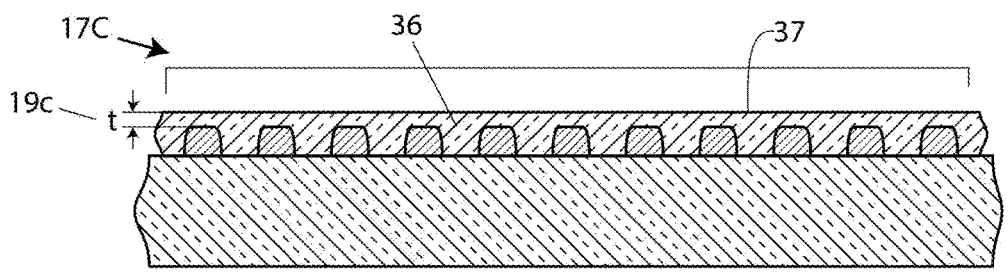
FIG. 3D is a cross-sectional view showing the result of spinning on a planarizing layer of insulating material.

FIG. 3D depicts a portion of a completed charge storage array 17C showing the result of applying a planarizing layer 36 of insulating material to the metal pads 34 of FIG. 3C, creating a thin coating of insulating material atop each metal pad, the thin coating having a thickness t, 19c. Thickness t may be in the range of 100 nm to 2 μm for example. Planarizing layer 36 may be applied as a spin-on coating for example.

Figure 4:
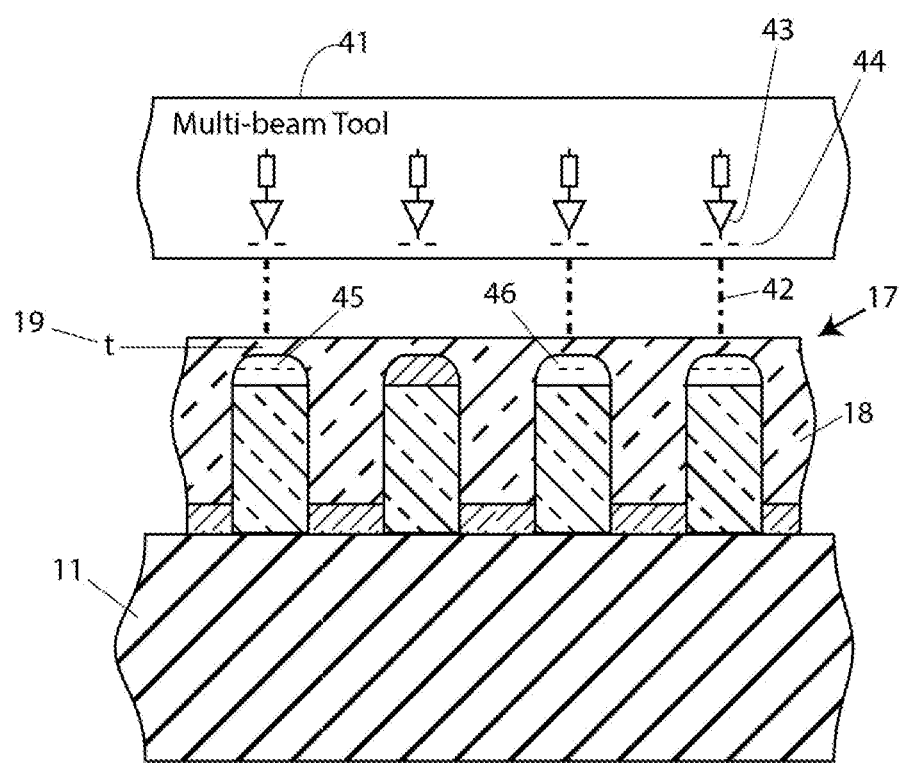
FIG. 4 is a cross-sectional schematic view showing the use of a multi-beam tool for charging the metal pads of a charge array structure.

FIG. 4 illustrates the charging of metal pads inside charge storage array 17 using beams of high energy particles. In order to speed up the charging of a large array of metal pads, for example $1.6 \times 10^{12}$ pads in an array measuring 1-inch×1-inch, it may be useful to employ multiple beams in a writing device. Each metal pad may be operable to store multiple bits of information, corresponding to multiple levels of charge, wherein the levels of charge can be detected by a reader that is sensitive to electric field strength, the relevant electric fields to be illustrated in FIG. 5.

Accordingly, an exemplary embodiment of the present invention is a memory array comprising closely spaced charge storage cells. The memory may be used as a one-time programmable (OTP) device, since the equipment required to write the array may be expensive. FIG. 4 shows a multi-beam tool 41, capable of generating high energy particle beams 42, preferably spaced apart at the same spacing as the repeat distance of the charge array, or a multiple of this distance. Particle beams 42, also referred to as charged particle beams, may be produced by an e-beam device, or by an ion implantation device as examples. Preferably the control of each beam includes an amplifier 43 to regulate the beam current, and a shut-off component 44. The charge injected into each metal pad is predetermined by beam current and duration; in the figure, a large charge 45 and a small charge 46 are shown. The charged entities injected into a metal pad traverse a layer of insulating material having a thickness t, 19. The mechanism for transport of charged particles across thickness t may be Fowler Nordheim tunneling for example. If an ion implantation device is used instead of an e-beam, the amount of charge injected is also predetermined, using beam current calculations. Different charging configurations can be used with different embodiments of the charge array structure.

As described herein, embodiments of the present invention provide for retention of charge stored on conductive (e.g., metal) pads in relation to a variety of charge storage structures. Leakage current will be negligible if dissipative tunneling currents are avoided. If insulating material 18 is highly insulating, for example, a pure material of high quality, lacking point defects for example, there will be no pathway for charge to leak from its metal pad via tunneling; "defect hopping" will be avoided. Also, since tunneling currents are known to increase with increasing temperature, it is recommended in embodiments of the current invention employing charge array structures that the temperature be controlled, at around 20° C. for example. When applied to a charge storage cell in an embodiment of the present invention, "charge retentive" is defined as retaining at least 95% of a programmed level of charge for a period of at least one month.

Figure 5:
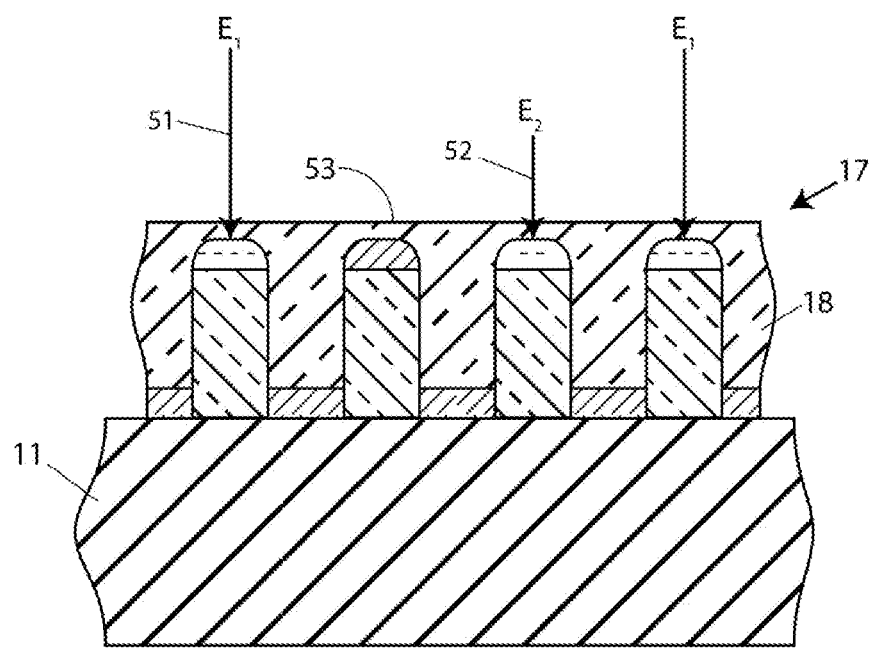
FIG. 5 is a cross-sectional view depicting an electric field penetrating the top layer of each programmed cell of a charge array structure, in accordance with a charge on the associated metal pad.

FIG. 5 illustrates the electric fields generated at the top of each programmed charge storage cell in charge storage array 17. Corresponding to the charge levels shown in FIG. 4, electric fields E1, 51, and E2, 52 are shown penetrating the thin insulating layer atop each metal pad, and existing in the space above the top surface 53 of the planarizing layer 18 of insulating material.

Figure 6:
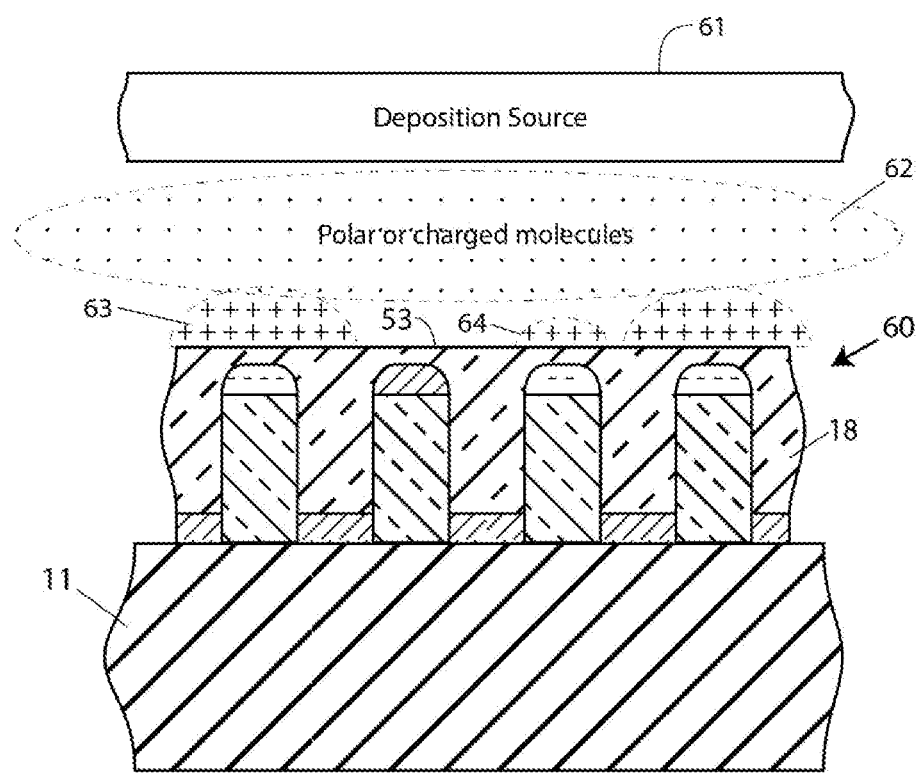
FIG. 6 is a cross-sectional schematic view depicting a deposition source providing charged molecules in a cloud that is presented to the charge array structure of FIG. 5, now described as a patterning web, and the accumulation of charged molecules at the top surface of the patterning web, in response to the electric fields shown in FIG. 5.

FIG. 6 illustrates the accumulation of deposition material on a charge storage array which is now described as a patterning substrate or a patterning web 60 in anticipation of its use as a device for patterning molecules, according to an embodiment of the present invention. A source of deposition material is shown 61, creating a cloud 62 of ionized material comprising charged molecules 63 or electrically polar molecules. The charged molecules 63 are attracted by the electric field shown in FIG. 5, and become accumulated molecules at the top surface 53 of patterning web 60. The charged molecules can also be considered to accumulate because of Coulomb forces between the molecules and the opposite electrical charge on the corresponding metal pad. A smaller accumulation 64 corresponds with a smaller charge as shown.

Figure 7A:
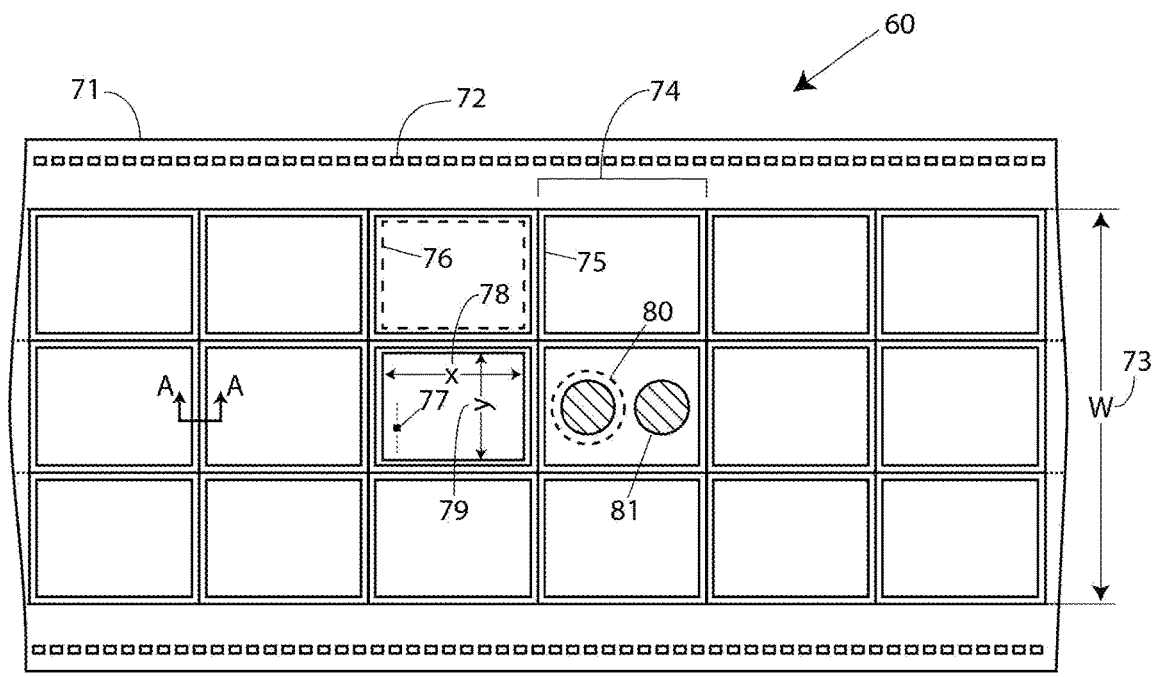
FIG. 7A is a top view of a patterning web according to an embodiment of the present invention.

FIG. 7A illustrates a portion of patterning web 60 in an embodiment of the present invention. Substrate 71 may have a metal foil base or an insulating base, as previously described in reference to FIGS. 1A and 2A, respectively. Sprocket holes 72 are shown as an example of a configuration used for advancing the patterning web using sprocketed wheels. Other mechanical transport means may be used. The width W, may be around 1-2 meters for example in a production machine, or narrower in a prototyping machine. An interior portion is tiled with patterning areas 74 of a constant size in this example. A mix of different tile sizes can also be used. Each patterning area 74 includes an alignment feature 75, and interior to the alignment feature a patterning region 76 as shown. Thus, the alignment region is provided peripherally to the patterning region. The alignment feature may have a rectangular shape as shown, or it may consist of multiple smaller shapes. Patterning region 76 includes multiple pixels 77 of an image to be deposited. Each pixel may comprise a single charge storage cell, or a matrix of charge storage cells used for convenience of programming pixels instead of individual cells. Patterning region 76 has an x-dimension 78 and a y-dimension 79. The outline of a separation sensor 80 is shown, together with the outline of an alignment sensor 81, configured on a tile that has no patterning region.

Figure 7B:
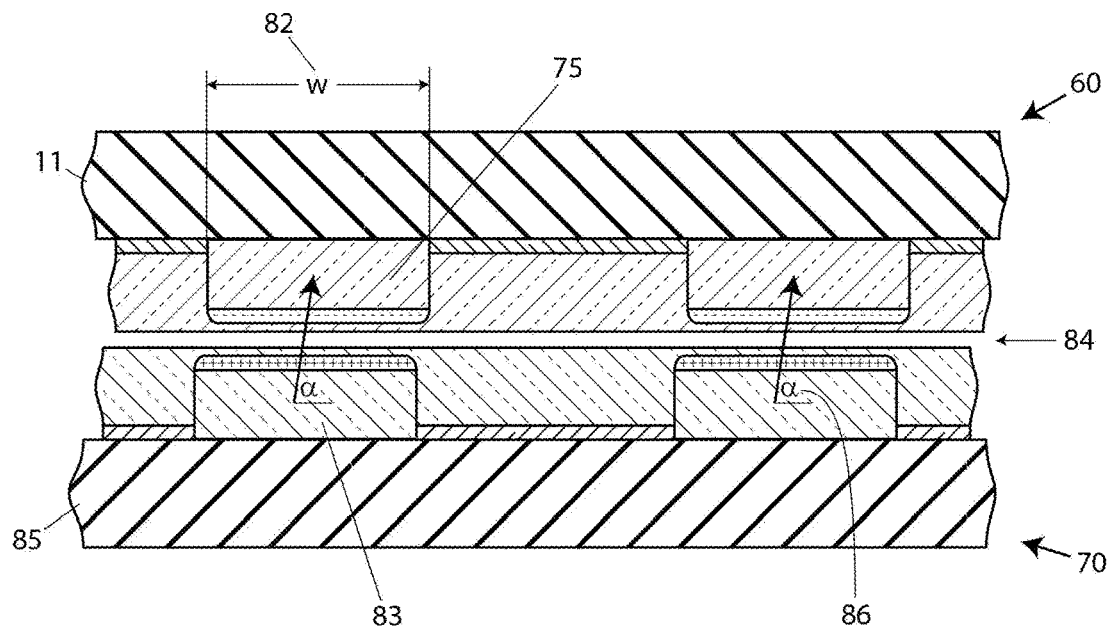
FIG. 7B is a cross-sectional view corresponding to section AA of FIG. 7A, and including a target substrate for viewing the alignment process.

FIG. 7B illustrates a portion of patterning web 60, in a region peripheral to the charge storage array where alignment features are provided, indicated by section AA of FIG. 7A. Patterning web 60 is shown in face-to-face relation with a target substrate 70 having a metal base layer 85. Alignment feature 75 is shown at an expanded scale; it may have a width w 82 of 1 mm for example, and is in approximate alignment with a corresponding alignment feature 83 provided in target substrate 70. A small gap 84 exists between the substrates, to be further described. Alignment feature 83 has a charge polarity opposite to alignment feature 75, in order that they will be attracted to one another by Coulomb attraction. Alignment angle α 86 is shown.

Figure 8A:
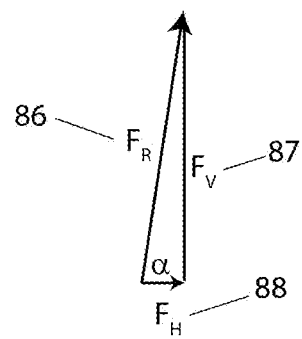
FIG. 8A is a vector diagram depicting the force components operating on a substrate during alignment.

FIG. 8A is a vector diagram showing a resultant alignment force $F_R$ 86, comprising a vertical force component $F_V$ 87 and a horizontal force component $F_H$ 88. The vertical force component 87 serves to separate the two substrates of FIG. 7B, and the horizontal force component 88 serves to align the two substrates precisely, to be further described.

Figure 8B:
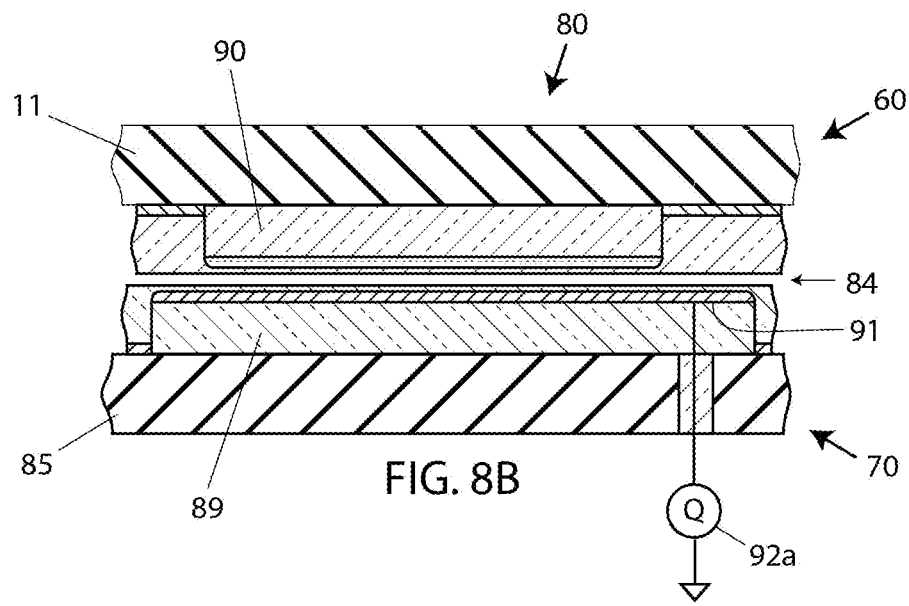
FIG. 8B is a cross-sectional view of a charge induction sensor that may be used to detect separation of a pair of substrates.

FIG. 8B is an expanded cross-sectional view of separation sensor 80 described in reference to FIG. 7A. The width of feature 89 in the target substrate 70 is greater than the width of feature 90 in the patterning web 60, so the amount of induced charge on sensing pad 91 will be insensitive to small misalignments. By monitoring this induced charge using a charge meter 92a, the point of separation between feature 89 and feature 90 can be detected. During alignment, patterning web 60 and target substrate 70 may be physically separated, as indicated by gap 84.

Figure 8C:
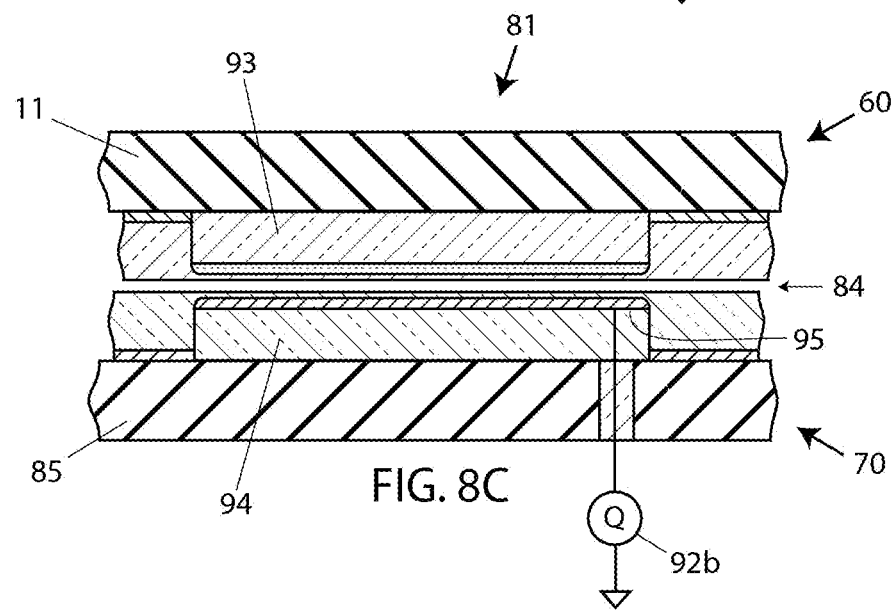
FIG. 8C is a cross-sectional view of a charge induction sensor that may be used to detect precision alignment of a pair of substrates.

FIG. 8C is an expanded cross-sectional view of alignment sensor 81 described in reference to FIG. 7A. Features 93 and 94 are shown with the same width. When substrates 60 and 70 are precisely aligned and gap 84 is reduced to zero, the induced charge in metal pad 95 will be maximized, as measured by charge meter 92b, and detection of this maximum will provide evidence that the two substrates are precisely aligned.

FIGS. 9A-9C will be used to describe the transfer process, in accordance with embodiments of the present invention.

In FIG. 9A we consider patterning web 60 in face-to-face relation with a target substrate 70B having a base layer 96 of insulating material. For effective transfer of accumulated materials such as 63, in a region where imaging of deposition material occurs, both the patterning web and the target substrate are required to have metal planes, or substantially continuous conductive planes, in order that voltages may be applied between them to effect the transfer of accumulated deposition materials from patterning web 60 to target substrate 70B using electrostatic forces, in accordance with embodiments of the present invention. Since target substrate 70B has an insulating base 96 rather than a conductive base, a transfer electrode 98 is provided adjacent the back side of target substrate 70B as shown. For alignment purposes, to be further described, an AC voltage source 99 is connected in series with a variable DC voltage source 100, and connected to transfer electrode 98 as shown. For alignment purposes and for transfer purposes, a variable DC voltage source 101 may be connected to the conductive base 11 of patterning web 60. For transfer purposes, a pulsed voltage source 102 is preferably connected as shown to transfer electrode 98.

Using the combination of variable DC voltage source 101 and pulsed voltage source 102, the accumulated materials are transferred 63b from patterning web 60 to target substrate 70B as shown in FIG. 9B. For a clean deposition of charged molecules onto a target substrate according to embodiments of the present invention, the desired image of deposited material will be programmed into the charge storage structure, material will accumulate on the patterning web in accordance with the desired image, and the accumulated material will transfer to the target substrate, also in accordance with the desired image, as shown by deposition 63b for example. AC voltage source 99 and pulsed voltage source 102 will be further described in reference to the following figures.

FIG. 9C illustrates the effect of finishing a deposition such as 63b of FIG. 9B, using a finishing station to be described.

For example, rolling and heating processes may be applied in a finishing station to achieve a modified form of the deposition, such as 103 shown in the figure.

Figure 10A:
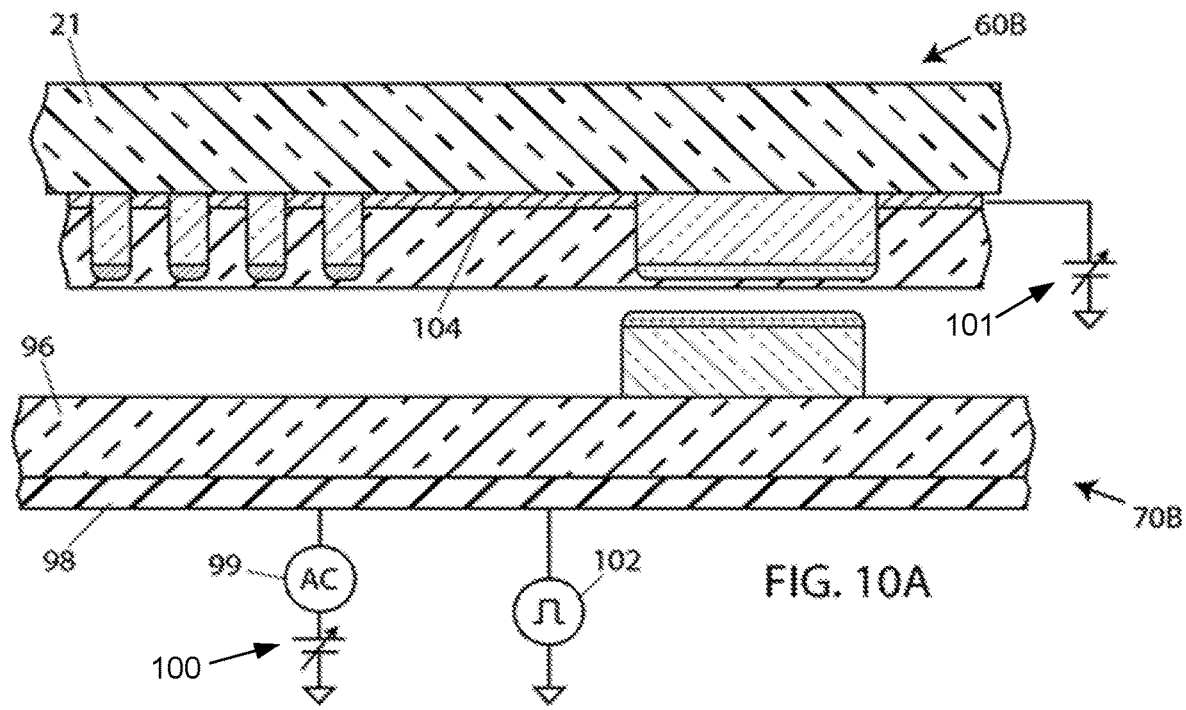
FIG. 10A is a cross-sectional view showing a pair of substrates during alignment, together with applied voltage sources that may be used for alignment and transfer, for the case that the target substrate is insulating and an electrode is provided adjacent the backside of the target substrate.
Figure 10B:
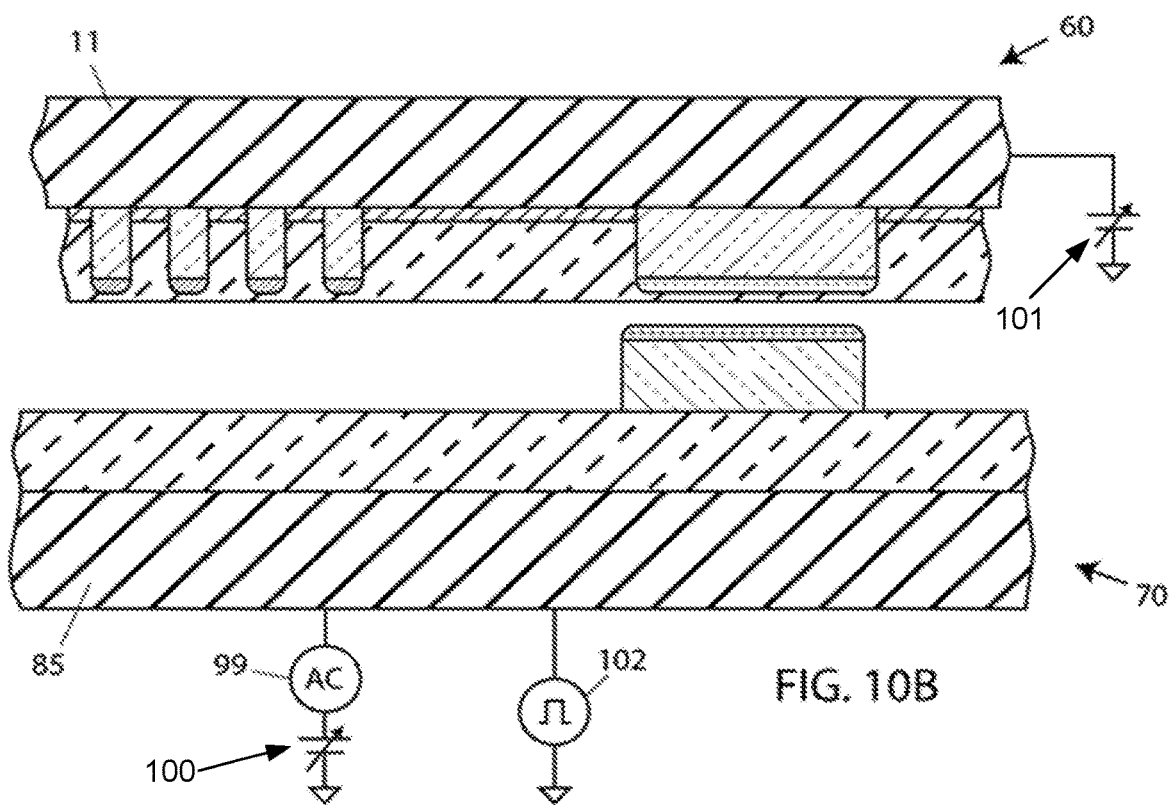
FIG. 10B is a cross-sectional view showing a pair of substrates during alignment, together with applied voltage sources that may be used for alignment and transfer, for the case that the target substrate has a conductive base such as a metal foil.

FIGS. 10A and 10B will be used to describe variations of the electrical connections required to effect the transfer process, taking account of different substrate materials, in accordance with embodiments of the present invention.

In FIG. 10A, voltage sources 99, 100, and 102 are connected to transfer electrode 98 as described in reference to FIG. 9A. However, in this case base substrate 21 of patterning web 60B is insulating rather than conductive. Accordingly, the connection of variable voltage source 101 is made to the substantially continuous conductive layer 104.

In FIG. 10B, voltage sources 99, 100, and 102 are connected to metallic base layer 85 of target substrate 70. Variable DC voltage source 101 is connected to metallic base layer 11 of patterning web 60.

Thus it can be seen that the transfer process can be adapted to work with a full range of substrate materials, from a conductive base to an insulating base, for both the patterning web and the target substrate, according to different embodiments of the present invention.

Figure 11A:
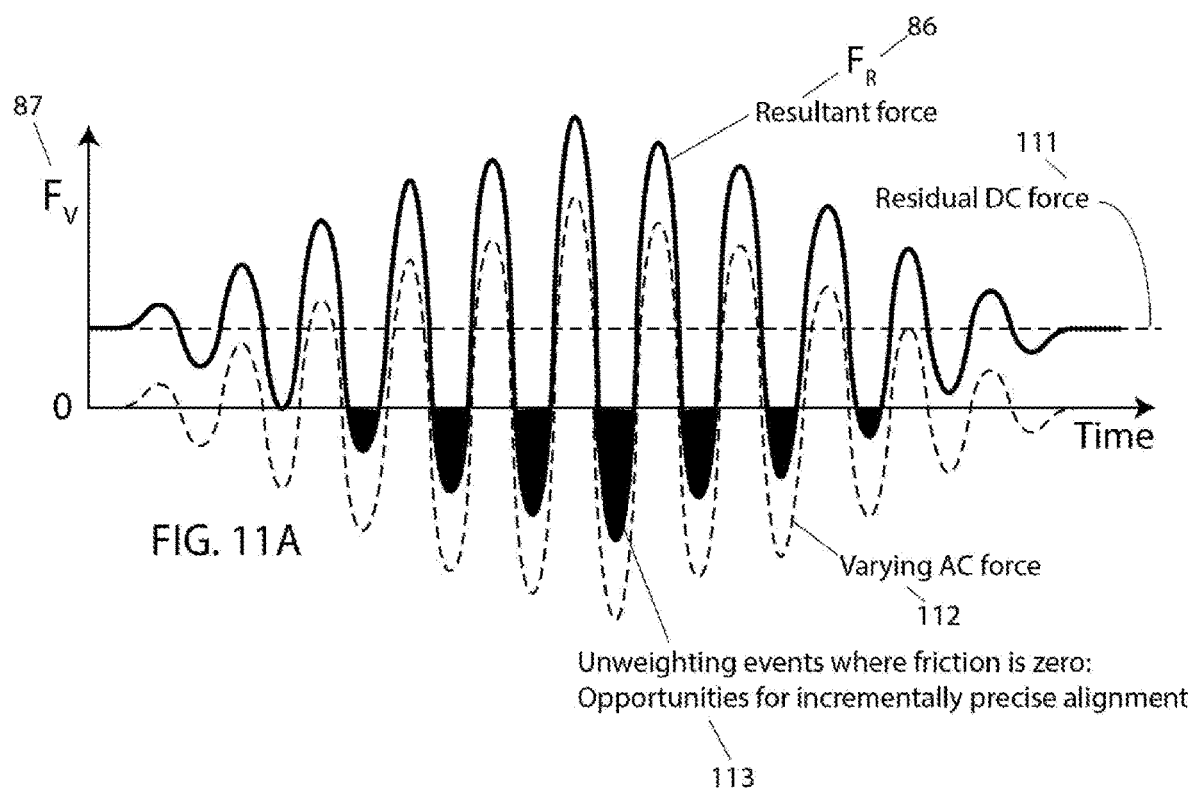
FIG. 11A is a graph of alignment force versus time, associated with an AC voltage source shown in FIGS. 10A and 10B.

FIG. 11A is a graph of vertical force $F_V$ 87 versus time, where $F_V$ is the vertical force between a pair of opposing substrates in face-to-face relation, during a procedure to achieve precision alignment between the two substrates, in accordance with an embodiment of the present invention. With no external voltages applied and with gap 84 between the substrates reduced to zero, there is a residual DC force of attraction 111 due to the features having opposite polarity of electrical charge in the two opposing substrates. A varying AC force 112 is shown, in response to the AC voltage 99 acting on charged elements in the two substrates. In a preferred embodiment, the amplitude of the AC voltage increases from zero and may pause for a period at a constant amplitude (not shown). As the amplitude increases, there are moments within each AC cycle wherein adhesive forces between the substrates are overcome, including any stiction forces, and the substrates separate slightly. When the substrates are separated, the friction between them is reduced to zero, and the restoring alignment force $F_H$ 88 of FIG. 8A, is operable to move the two substrates incrementally into more precise alignment. As the AC voltage decays, successive movements become smaller and smaller, until only the steady state adhesion remains to retain the substrates in precise alignment. The moment of separation can be detected by sensor 80 described in reference to FIG. 8B, indicating that the amplitude of the AC voltage does not need to be further increased. If the unweighting events 113 are affective in achieving precision alignment, this can be detected by sensor 81 described in reference to FIG. 8C, and the amplitude of the AC voltage reduced to zero as shown. If the desired level of alignment precision has not been met, then the process can be repeated a number of times to meet the requirement. This alignment method may be described as "active registration".

Figure 11B:
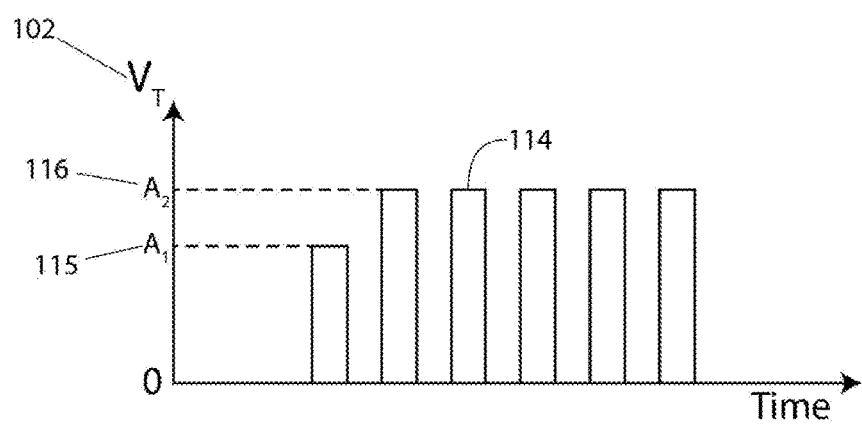
FIG. 11B is a graph of transfer voltage versus time, associated with a transfer voltage source shown in FIGS. 10A and 10B.

FIG. 11B is a graph of transfer voltage $V_T$ 102 versus time. Each pulse 114 provides a strong impulsive force (an impulse) for dislodging material that has accumulated on the patterning web, and is weakly attracted to the patterning web due to Coulomb forces previously described, in order to transfer it to the target substrate, where it resides on the surface until further actions are taken. A subsequent finishing process such as radiating with a laser beam may be used to initiate chemical or physical reactions in the deposited material, particularly if a deposited layer is chemically active with a previously deposited layer. Different amplitudes 115 and 116 of $V_T$ 102 may be employed as shown.

Figure 12:
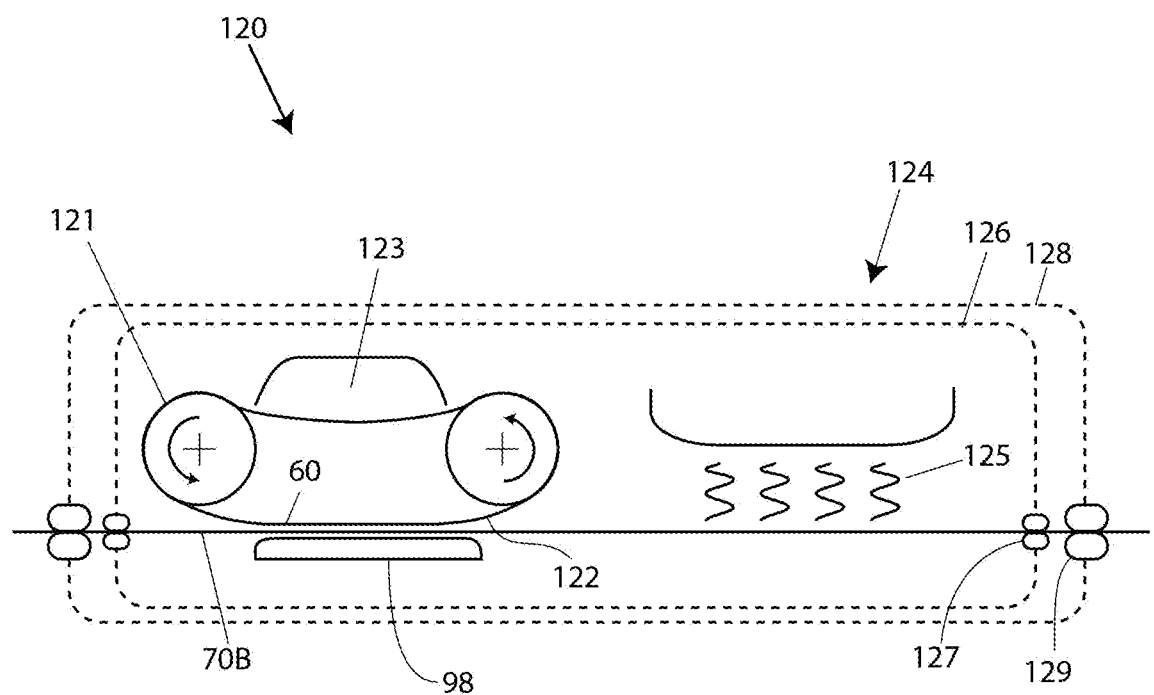
FIG. 12 is a schematic side view of an exemplary deposition module of the current invention.

FIG. 12 depicts a deposition module 120 in a further embodiment of the current invention. A patterning web 60 is shown, carried by rollers 121, wherein a loose draping 122 is provided to allow small movements of local regions of patterning web 60, to achieve precision alignment during the active registration process. A source of deposition materials 123 is shown. Target substrate 70B is shown with transfer electrode 98 shown adjacent at the backside of substrate 70B. A finishing station 124 is shown, providing radiated heat 125 in this example. Module 120 is optionally provided with a first chamber enclosure 126 supported by seals 127 which may be magnetic seals for example. Enclosure 126 may be used to provide a gas ambient other than air, such as the inert gas argon. Enclosure 128 is also optionally provided, supported by seals 129 that again may be magnetic seals. Enclosure 128 may be used to provide a vacuum environment. Other configurations comprising one or two chambers may be used, and they may be applied to just one deposition module, or to a series of deposition modules. The combined use of enclosures 126 and 128 may allow processing of sensitive materials, degradable by small amounts of oxygen or water for example, even though the seals required for a moving substrate may be imperfect seals.

Figure 13A:
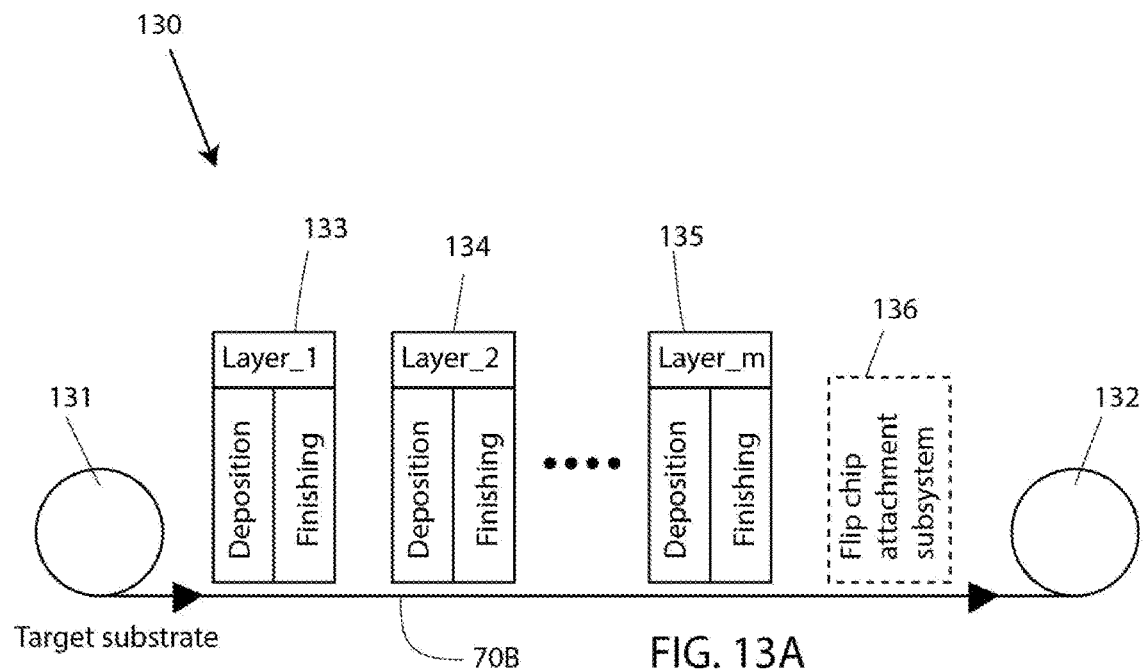
FIG. 13A is a schematic side view of an exemplary roll-to-roll system of the current invention, operating in an air ambient.

FIG. 13A depicts a roll-to-roll manufacturing system 130 in a further embodiment of the present invention. A target substrate 70B is shown, carried by rollers 131 and 132. A series of in-line deposition modules is shown, 133-135, and an optional flip chip attachment station 136 is also shown. A build-up of layers can be fabricated on the target substrate, up to twelve layers or more for example, with each deposition module contributing an additional layer. Each finishing station is optional, depending on the parameters of the deposition material at the companion deposition component. A further optional module is a singulation station, (not shown). Manufacturing system 130 is shown operating in an air ambient although it can be operated in a controlled environment.

Figure 13B:
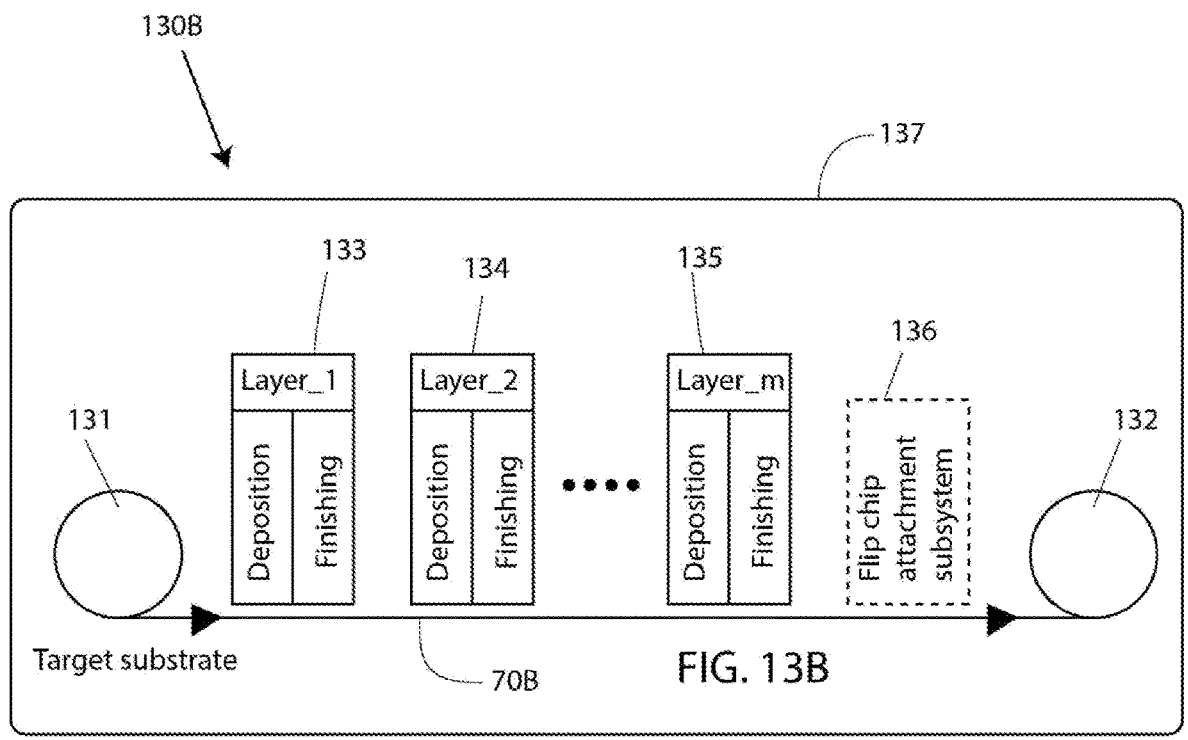
FIG. 13B is a schematic side view of an exemplary roll-to-roll system of the current invention, operating inside a vacuum chamber.

FIG. 13B depicts all of the elements of FIG. 13A in a manufacturing system designated 130B, because the entire system is contained within a vacuum chamber 137. A vacuum chamber 137 can be utilized for many deposition materials of interest, because they commonly react with air or moisture for example. Also, a vacuum environment will support a source of deposition materials 61 that produces a plasma 62 of charged particles, as depicted in FIG. 6.

Figure 14A:
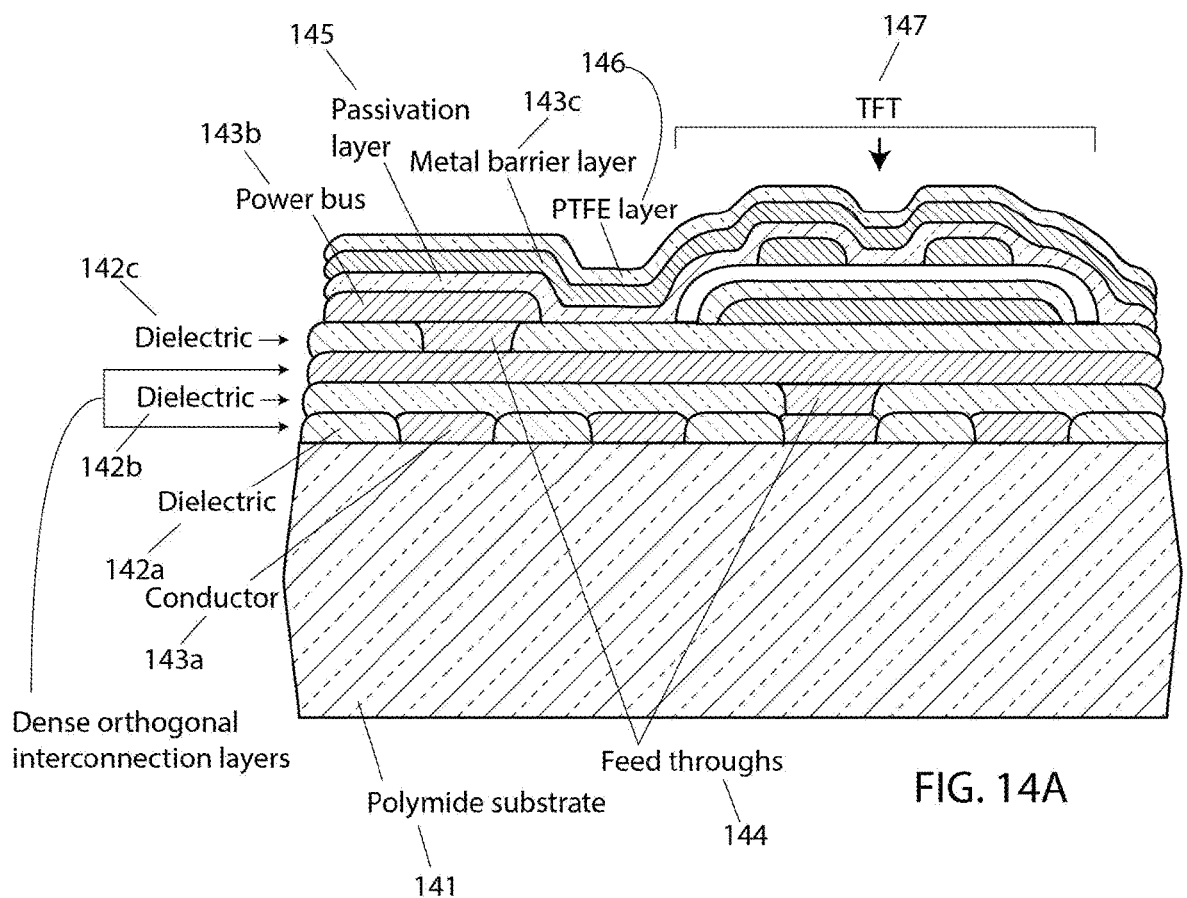
FIG. 14A is a cross-sectional view of fabricated layers of an exemplary electronic structure.

FIG. 14A illustrates a product comprising multiple layers of electronic materials, manufacturable using embodiments of the present invention. A polyimide substrate 141 is shown, with deposited dielectric layers 142a-142c as examples and deposited conductive layers 143a-143c as examples. Alternative substrate materials such as polyethylene terephthalate (PET) may also be used. Conductive feedthroughs 144 are shown, together with a passivation layer 145, and a polytetrafluoroethylene (PTFE) layer 146. A structure 147 corresponding to a thin film transistor (TFT) is also shown.

Figure 14B:
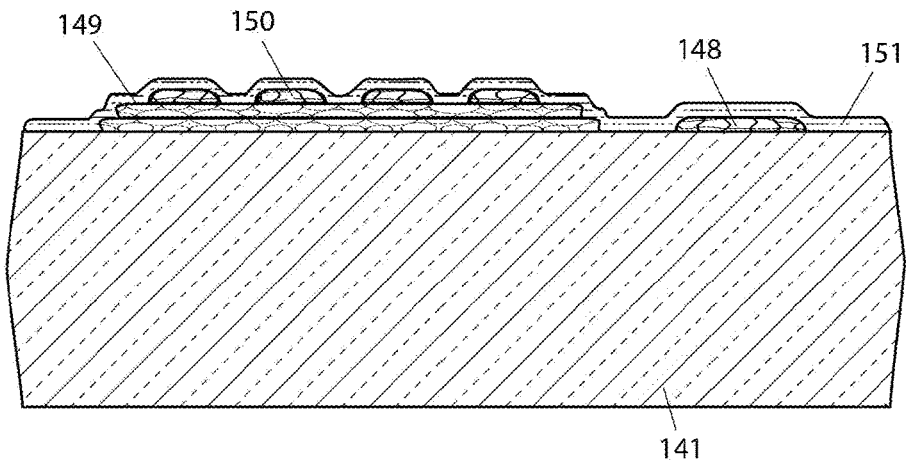
FIG. 14B is a cross-sectional view of fabricated layers of an exemplary biological structure.

FIG. 14B depicts a product comprising multiple layers of biological materials. Polyimide substrate 141 is shown, and a stacked arrangement of biological layers 148-150 is illustrated, together with a passivation layer 151.

Figure 15:
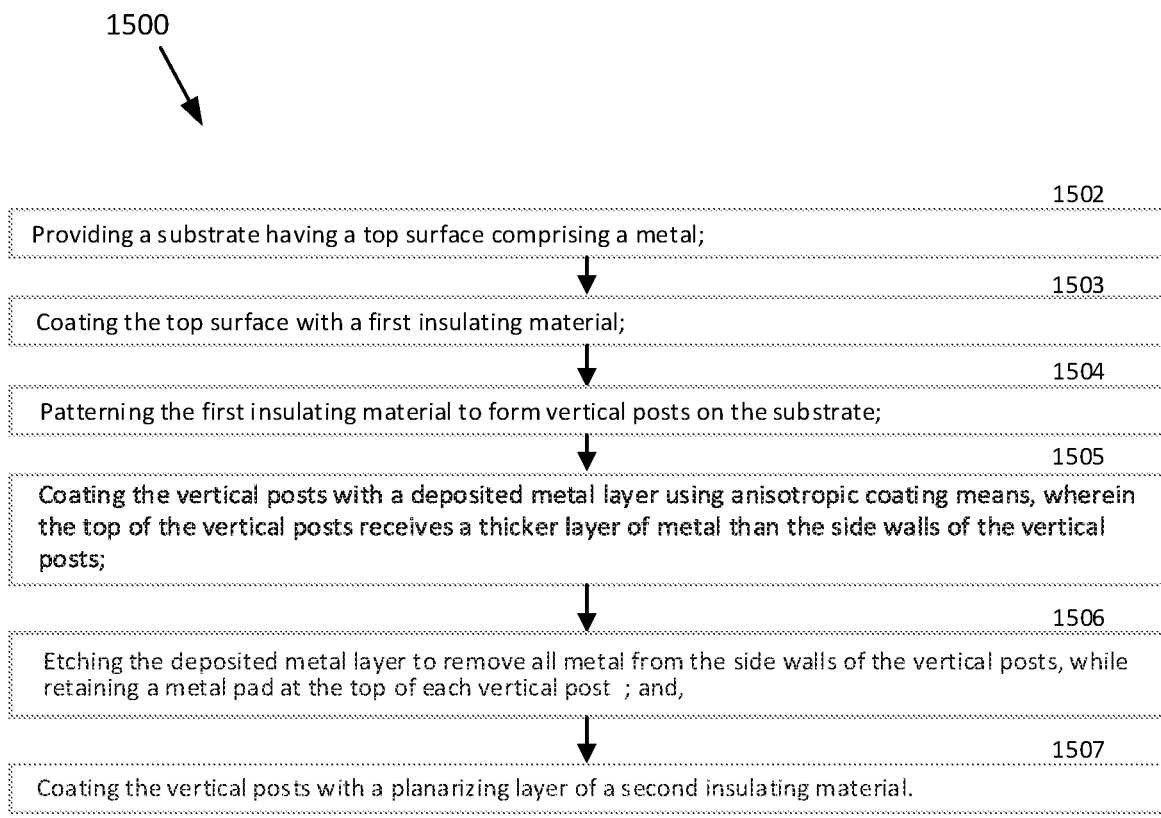
FIG. 15 is a flow chart depicting a method for fabricating an array of electrically charged elements on a substrate.

FIG. 15 is a flow chart showing a first exemplary process for fabricating an array of electrically charged elements on a substrate 1500. It will be appreciated that the process may include additional or fewer steps and that the order of the steps may vary from that shown in FIG. 15 and described below. The method for fabricating the array of electrically charged elements on a substrate 1500 includes providing a substrate having a top surface comprising a metal (1502) and coating the top surface with a first insulating material (1503). The method also includes patterning the first insulating material to form vertical posts on the substrate (1504) and coating the vertical posts with a deposited metal layer using an anisotropic coating process. In this coating process, the top of the vertical posts receives a thicker layer of metal than the side walls of the vertical posts (1505).

The method further includes etching the deposited metal layer to remove metal (e.g., all metal) from the side walls of the vertical posts, while retaining a metal pad at the top of each vertical post (1506) and coating the vertical posts with a planarizing layer of a second insulating material (1507).

Figure 16:
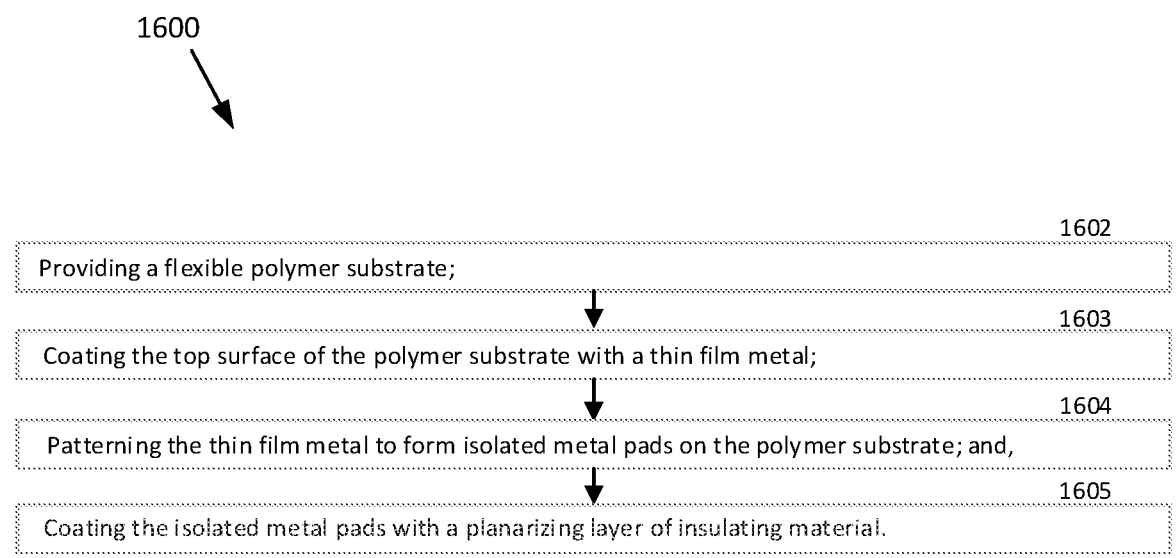
FIG. 16 is a flow chart depicting an alternative method for fabricating an array of electrically charged elements on a substrate.

FIG. 16 is a flow chart showing a second exemplary process for fabricating an array of electrically charged elements on a substrate 1600. It will be appreciated that the process may include additional or fewer steps and that the order of the steps may vary from that shown in FIG. 16 and described below. The method 1600 includes providing a flexible polymer substrate (1602), coating the top surface of the polymer substrate with a thin film metal (1603), and patterning the thin film metal to form isolated metal pads on the polymer substrate (1604). The method also includes coating the isolated metal pads with a planarizing layer of insulating material (1605).

Figure 17:
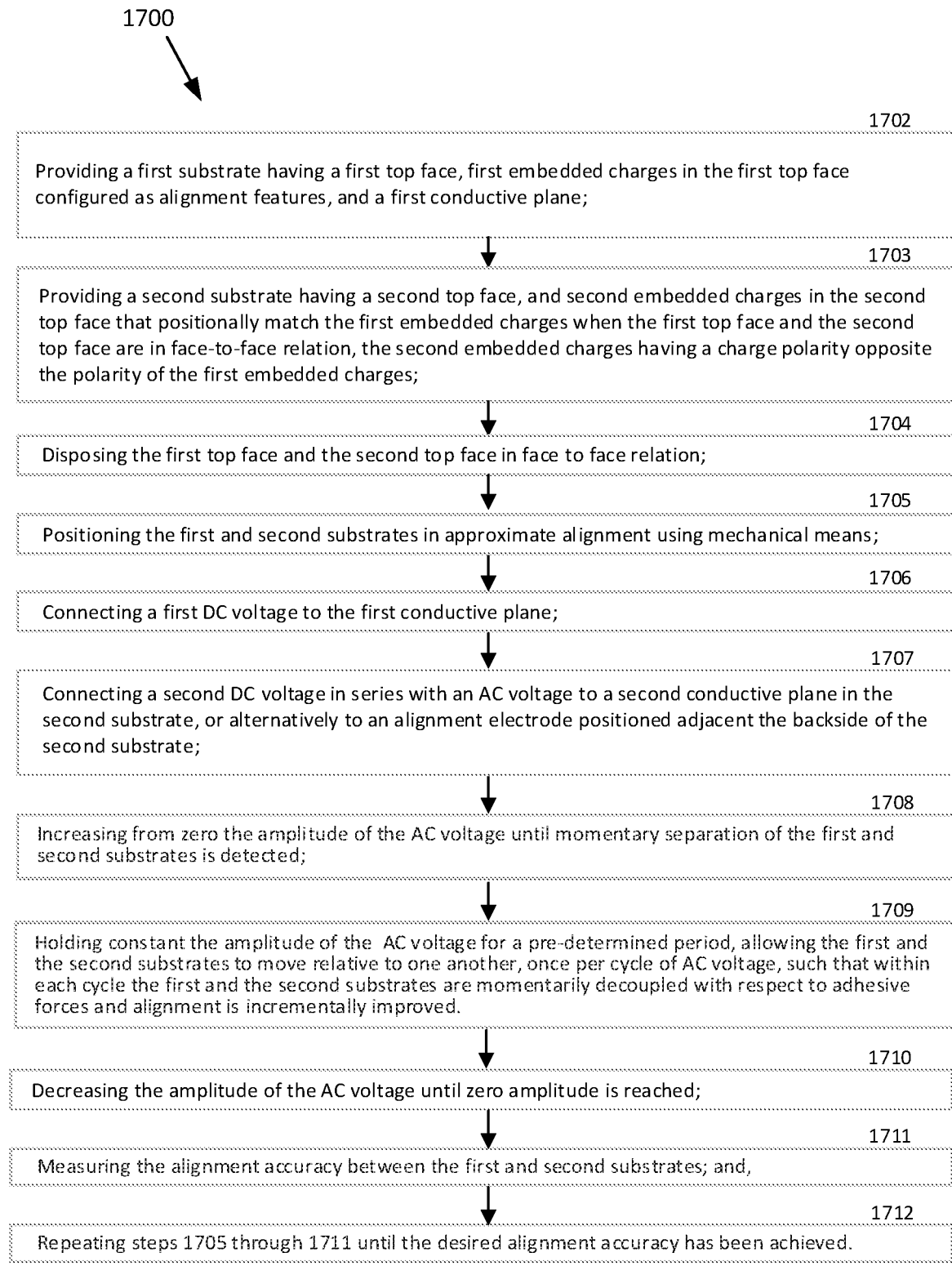
FIG. 17 is a flow chart depicting an exemplary method for aligning a pair of substrates.

FIG. 17 is a flow chart showing an exemplary process for aligning a first and a second substrate 1700. It will be appreciated that the process may include additional or fewer steps and that the order of the steps may vary from that shown in FIG. 17 and described below. The method 1700 includes providing a first substrate having a first top face, first embedded charges in the first top face configured as alignment features, and a first conductive plane (1702) and providing a second substrate having a second top face, and second embedded charges in the second top face that positionally match the first embedded charges when the first top face and the second top face are in face-to-face relation (1703). The second embedded charges have a charge polarity opposite the polarity of the first embedded charges.

The method also includes disposing the first top face and the second top face in face to face relation (1704) and positioning the first and second substrates in approximate alignment using mechanical means (1705). The method further includes connecting a first DC voltage to the first conductive plane (1706) and connecting a second DC voltage in series with an AC voltage to a second conductive plane in the second substrate, or alternatively to an alignment electrode positioned adjacent the backside of the second substrate (1707). Additionally, the method includes increasing from zero the amplitude of the AC voltage until momentary separation of the first and second substrates is detected (1708) and optionally holding constant the amplitude of the AC voltage for a pre-determined period, allowing the first and the second substrates to move relative to one another, once per cycle of AC voltage, such that within each cycle the first and the second substrates are momentarily decoupled with respect to adhesive forces and alignment is incrementally improved (1709).

Moreover, the method includes decreasing the amplitude of the AC voltage until zero amplitude is reached (1710), measuring the alignment accuracy between the first and second substrates (1711), and repeating steps as necessary (for example steps 1705, and 1708 through 1711), until the desired alignment accuracy has been achieved (1712).

Figure 18:
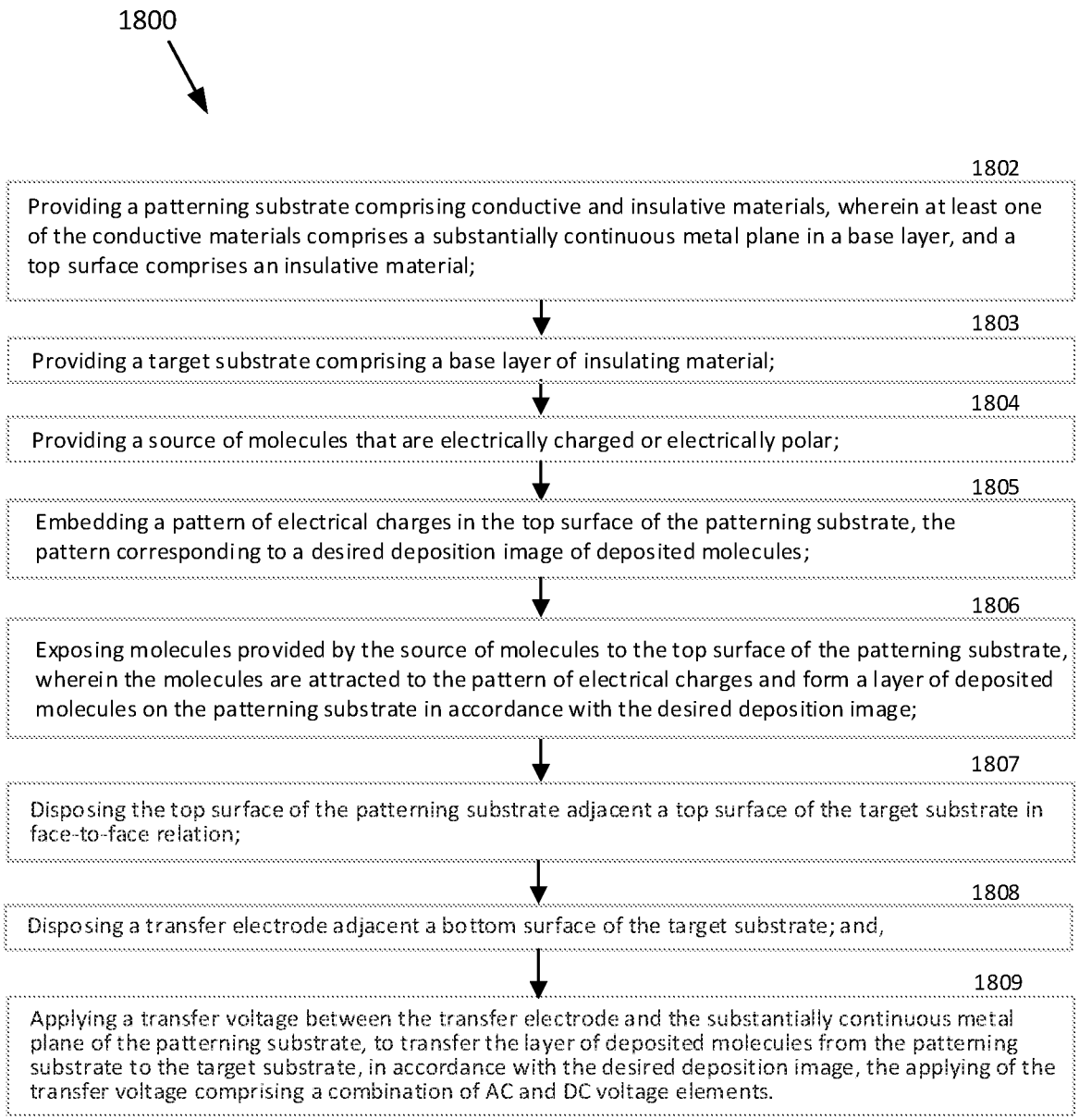
FIG. 18 is a flow chart depicting an exemplary method for depositing a patterned layer of molecules on a target substrate, wherein the target substrate comprises an insulating material.

FIG. 18 is a flow chart showing a first exemplary process for depositing a patterned layer of molecules on a target substrate 1800. It will be appreciated that the process may include additional or fewer steps and that the order of the steps may vary from that shown in FIG. 18 and described below. The method 1800 includes providing a patterning substrate comprising conductive and insulating materials (1802). At least one of the conductive materials comprises a substantially continuous metal plane in a base layer, and a top surface comprises an insulating material. The method also includes providing a target substrate comprising a base layer of insulating material (1803), providing a source of molecules that are electrically charged or electrically polar (1804), and embedding a pattern of electrical charges in the top surface of the patterning substrate (1805). The pattern corresponds to a desired deposition image of deposited molecules.

The method further includes exposing molecules provided by the source of molecules to the top surface of the patterning substrate (1806). The molecules are attracted to the pattern of electrical charges and form a layer of deposited molecules on the patterning substrate in accordance with the desired deposition image. Moreover, the method includes disposing the top surface of the patterning substrate adjacent a top surface of the target substrate in face-to-face relation (1807), disposing a transfer electrode adjacent a bottom surface of the target substrate (1808), and applying a transfer voltage between the transfer electrode and the substantially continuous metal plane of the patterning substrate, to transfer the layer of deposited molecules from the patterning substrate to the target substrate, in accordance with the desired deposition image, the applying of the transfer voltage comprising a combination of AC and DC voltage elements (1809).

Figure 19:
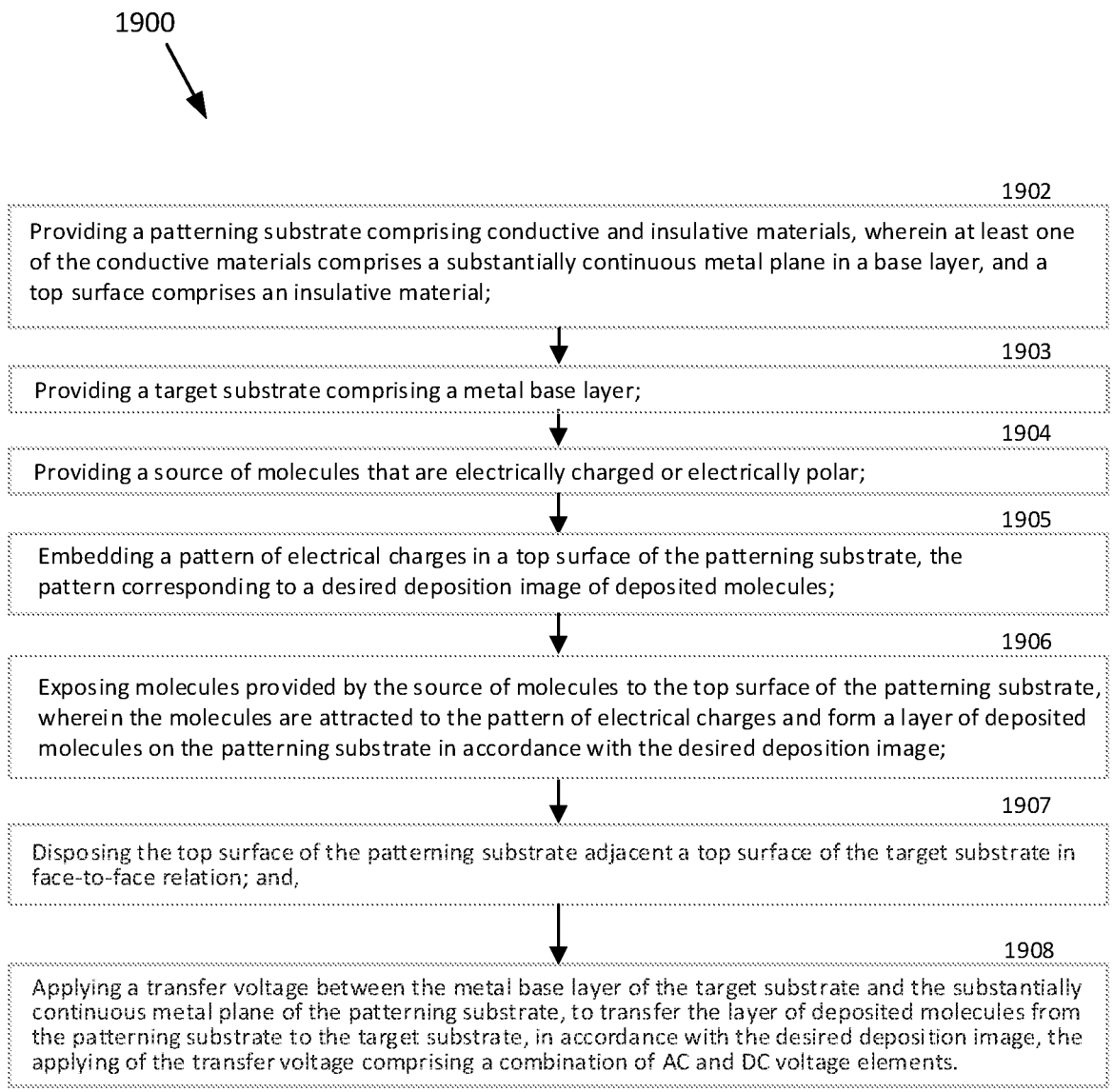
FIG. 19 is a flow chart depicting an alternative exemplary method for depositing a patterned layer of molecules on a target substrate, wherein the target substrate comprises a metal base layer.

FIG. 19 is a flow chart showing a second exemplary process for depositing a patterned layer of molecules on a target substrate 1900. It will be appreciated that the process may include additional or fewer steps and that the order of the steps may vary from that shown in FIG. 19 and described below. The method 1900 includes providing a patterning substrate comprising conductive and insulating materials (1902). At least one of the conductive materials comprises a substantially continuous metal plane in a base layer, and a top surface comprises an insulating material. The method also includes providing a target substrate comprising a metal base layer (1903), providing a source of molecules that are electrically charged or electrically polar (1904), and embedding a pattern of electrical charges in a top surface of the patterning substrate. The pattern corresponds to a desired deposition image of deposited molecules (1905).

The method further includes exposing molecules provided by the source of molecules to the top surface of the patterning substrate (1906). The molecules are attracted to the pattern of electrical charges and form a layer of deposited molecules on the patterning substrate in accordance with the desired deposition image. Moreover, the method includes disposing the top surface of the patterning substrate adjacent a top surface of the target substrate in face-to-face relation (1907) and applying a transfer voltage between the metal base layer of the target substrate and the substantially continuous metal plane of the patterning substrate. The transfer voltage transfers the layer of deposited molecules from the patterning substrate to the target substrate, in accordance with the desired deposition image, the applying of the transfer voltage comprising a combination of AC and DC voltage elements (1908).

Figure 20:
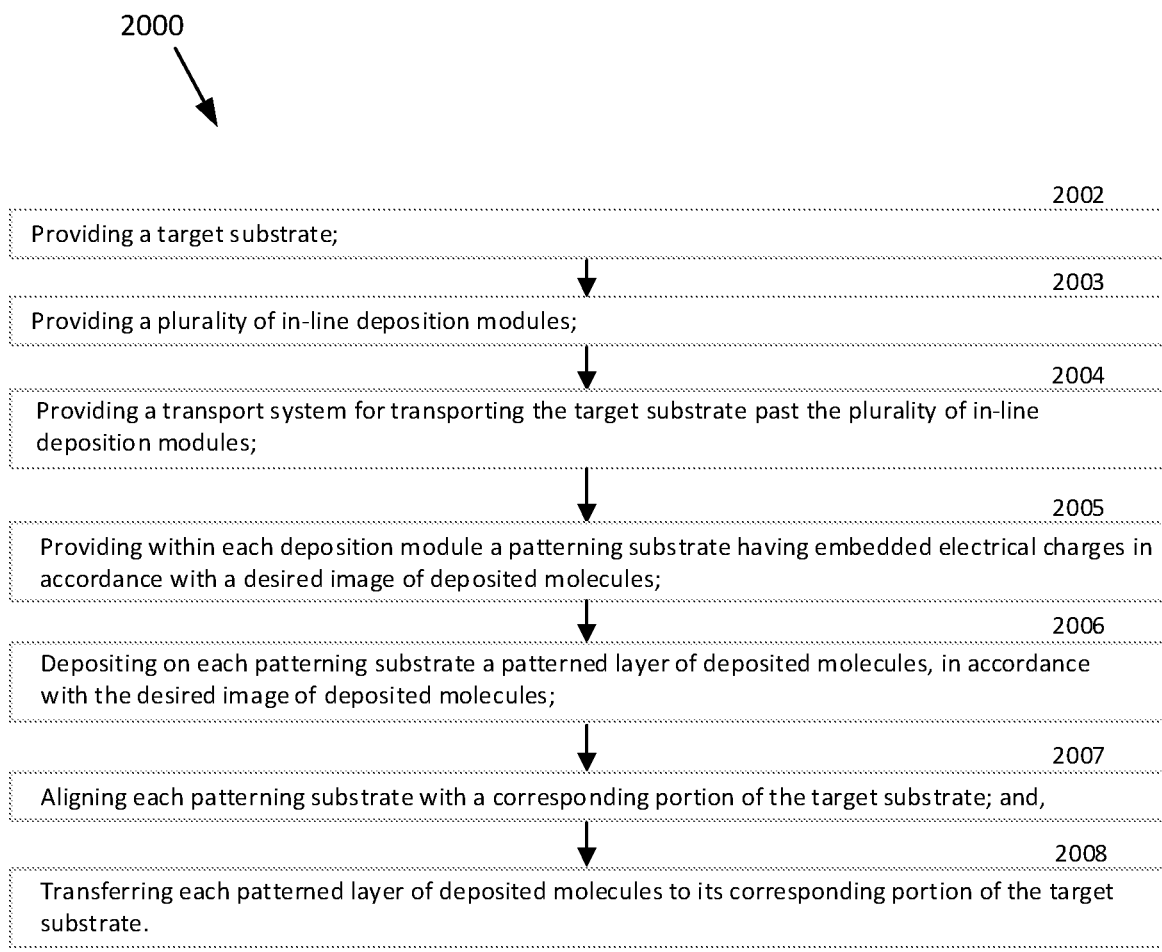
FIG. 20 is a flow chart depicting an exemplary method for fabricating a plurality of molecular layer depositions on a substrate in a roll-to-roll manner.

FIG. 20 is a flow chart showing an exemplary process for fabricating a plurality of molecular layer depositions on a substrate in a roll-to-roll manner 2000. It will be appreciated that the process may include additional or fewer steps and that the order of the steps may vary from that shown in FIG. 20 and described below. The method 2000 includes providing a target substrate (2002) and providing a plurality of in-line deposition modules (2003). The method also includes providing a transport system for transporting the target substrate past the plurality of in-line deposition modules (2004), providing within each deposition module a patterning substrate having embedded electrical charges in accordance with a desired image of deposited molecules (2005), and depositing on each patterning substrate a patterned layer of deposited molecules, in accordance with the desired image of deposited molecules (2006).

The method further includes aligning each patterning substrate with a corresponding portion of the target substrate (2007) and transferring each patterned layer of deposited molecules to its corresponding portion of the target substrate (2008).

Figure 21:
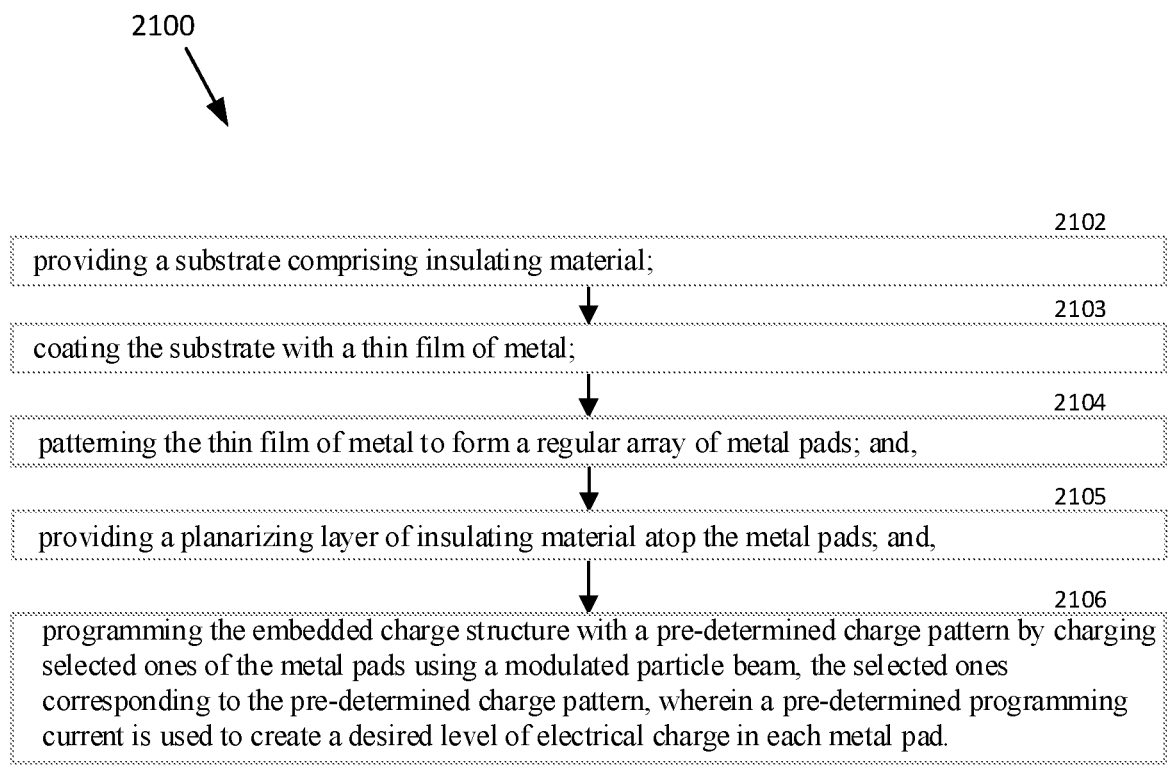
FIG. 21 is a flow chart depicting an exemplary method for fabricating an embedded charge structure.

FIG. 21 is a flow chart showing an exemplary process for manufacturing an embedded charge structure 2100. It will be appreciated that the process may include additional or fewer steps and that the order of the steps may vary from that shown in FIG. 21 and described below. The method includes providing a substrate comprising insulating material (2102) and coating the substrate with a thin film of metal (2103). The method also includes patterning the thin film of metal to form a regular array of metal pads (2104) and providing a planarizing layer of insulating material atop the metal pads (2105).

The method further includes programming the embedded charge structure with a pre-determined charge pattern by charging selected ones of the metal pads using a modulated particle beam, the selected ones corresponding to the pre-determined charge pattern, wherein a pre-determined programming current is used to create a desired level of electrical charge in each metal pad (2106).

Figure 22A:
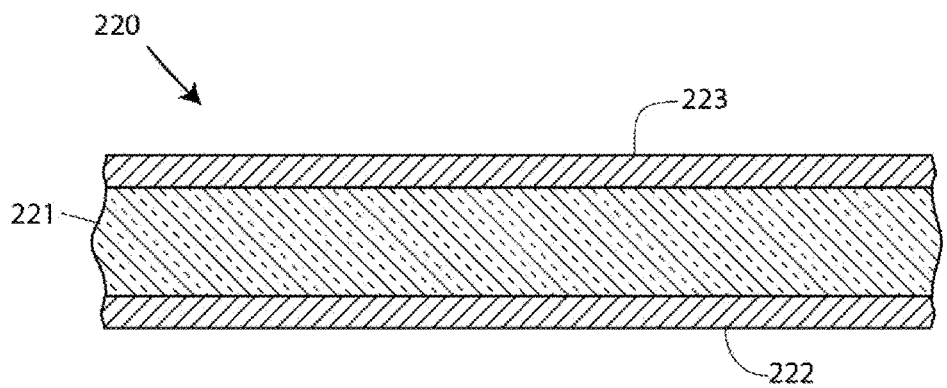
FIG. 22A is a cross-sectional view of an insulating substrate having a metallic coating on the top side and on the bottom side.

FIG. 22A illustrates a non-conductive substrate 221 having a conductive layer 222 on the bottom side of the substrate, and a conductive layer 223 on the top side of the substrate, opposite the bottom side. An alternative configuration includes a conductive substrate at the bottom side coupled to a non-conductive material that is coated with a conductive layer 223 on the top side. This latter configuration supports the use of a metal foil substrate such as a flexible stainless-steel foil.

Figure 22B:
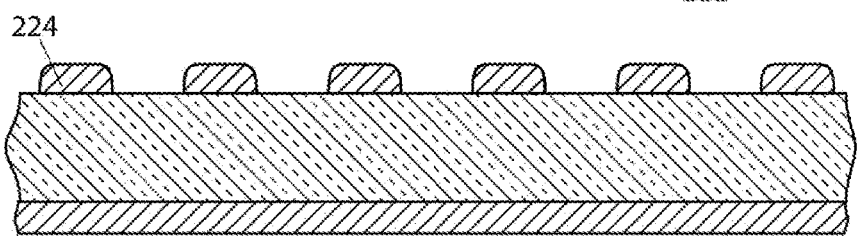
FIG. 22B is a cross-sectional view showing an array of isolated metal pads on the top side of an insulating substrate.

FIG. 22B shows that isolated metal pads 224 have been formed from the top side conductive layer 223. This is the first step in the creation of individual charge storage cells. The completed charge storage cells may be arrayed to form a regular array of cells, and the regular array may be incorporated as a charge storage array in manufacturing equipment for example.

Continuing with FIG. 22B, the process for forming the isolated metal pads may comprise a wet etch or a dry etch or patterning using an e-beam. Since e-beam pattering of an optimized resist material is capable of fine resolutions having 10 nm features for example, the repeat distance between metal pads (representing the width of a charge storage cell) may be as small as 20 nm for example. Optionally metal pads 224 may be electroplated to increase their thickness, thus providing a more substantial stop to charged particles of a charged particle beam that may be used to charge each of the charge storage cells. Consideration of the stopping distance becomes more important if heavy ions are used in place of electrons or protons; these heavy ions could be provided in ion implantation machines for example.

Figure 22C:
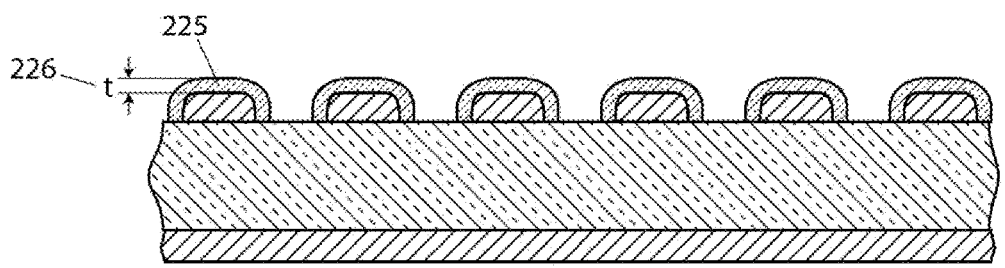
FIG. 22C is a cross-sectional view showing an insulative layer on each of the metal pads in an array of pads.

FIG. 22C shows that an insulative layer 225 has been formed to cover the exposed surface of each metal pad. A tunneling current through insulative layer 225 may be used to charge the metal pads if the thickness t 226 of the insulative layer 225 is adequately thin. A thickness of 100 nm-2 μm may be suitable, depending on the charged particle beam to be used.

It is known that new charged particle accelerators are under development, some capable of injecting electrons, others capable of injecting protons, in machines having reduced size, weight and cost compared against pre-existing machines.

Figure 22D:
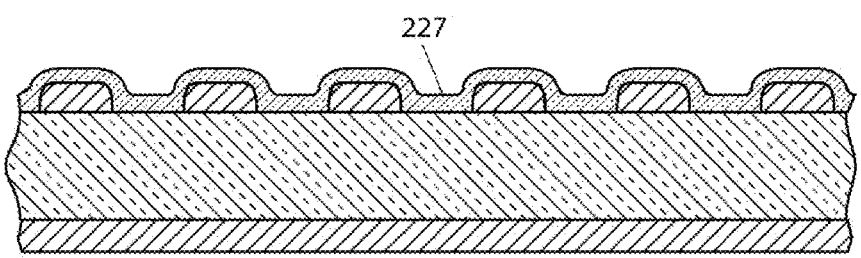
FIG. 22D is a cross-sectional view showing an insulative layer covering the top side of a substrate, including a covering over each of the metal pads in an array of pads.

FIG. 22D shows a typical result of using a chemical vapor deposition (CVD) process as one of the available methods for covering the metal pads with an insulative layer 227. Layer 227 may be described as a "blanket layer".

Figure 22E:
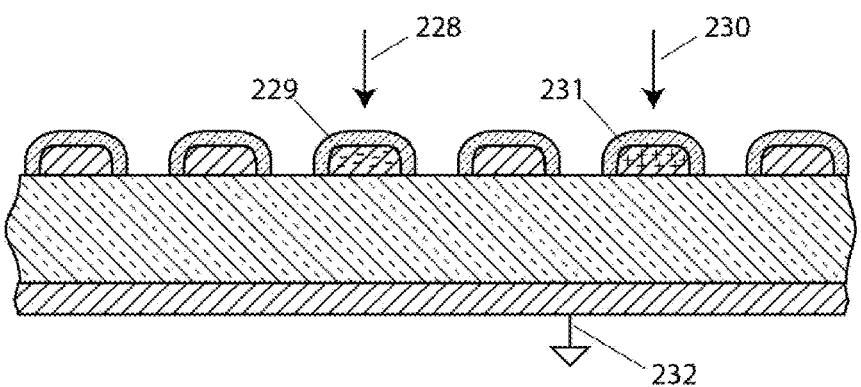
FIG. 22E is a cross-sectional view depicting the injection of charge into metal pads in an array of pads, where a modulated particle beam is used to charge a corresponding metal pad either positively or negatively.

FIG. 22E depicts the injection of electrons using an electron beam 228. Following injection at a suitable charging current and for a suitable duration the metal pad will support a negative charge 229. Alternatively, proton beam 230 may be used to inject a positive charge 231 as shown. An electrical ground connection 232 may be provided as shown. The presence of an electric charge in a metal pad will induce a double layer of charge (not shown) in the adjacent insulative layer.

Depending primarily on the insulating quality of non-conductive substrate 221 and insulating layer 225, injected charges may persist with 90% retention for months or years. Accordingly, the material and the process used to create the insulative layer are to be carefully selected, accounting for defect density, properties of the insulative material as a film, film homogeneity, resistance to environmental degradation under operating conditions of equipment in which the proposed charge storage array is to be used, and wear resistance in the operating environment.

FIG. 23 depicts a flow chart of an alternative exemplary method 2300 for fabricating an array of electrically charged elements on a substrate. It will be appreciated that the method may include additional or fewer steps and that the order of the steps may vary from that shown in FIG. 23 and described below. The method 2300 includes providing a substrate comprising an insulating material and having a metallic coating on each of the bottom side and the top side of the substrate (2301) and patterning the metallic coating on the top side to form a regular array of metal pads; (2302). The method also includes providing an insulating layer around exposed portions of each metal pad in the regular array of metal pads 2303; and, charging selected ones of the metal pads using a modulated particle beam, the selected ones corresponding to a pre-determined charge pattern for a charge storage array comprising the regular array of metal pads, wherein a pre-determined charging current is used to create a desired level of electrical charge in each of the selected ones of the metal pads. (2304).

It should be appreciated that the specific steps illustrated in FIGS. 15-23 provide particular methods according to embodiments of the present invention. Other sequences of steps may also be performed according to alternative embodiments. For example, alternative embodiments of the present invention may perform the steps outlined above in a different order. Moreover, the individual steps illustrated in FIGS. 15-23 may include multiple sub-steps that may be performed in various sequences as appropriate to the individual step. Furthermore, additional steps may be added or removed depending on the particular applications. One of ordinary skill in the art would recognize many variations, modifications, and alternatives.

Embodiments of the present invention directed at manufacturing systems are amenable to automation and have the potential for low fabrication cost. Furthermore, embodiments include agile manufacturing systems that are electronically programmable with regard to the desired patterns of the constituent layers of a multi-layer product. These agile systems can have short turn-around times for the production of products with variable patterning requirements and are cost effective for short production runs as well as for long production runs.

Charge storage cells such as flash memory cells have traditionally been fabricated on silicon wafers (i.e., silicon substrates) and have taken advantage of silicon dioxide as a high-quality insulator. The silicon dioxide is typically formed by oxidizing silicon in a furnace. Typically, a floating gate structure is provided in which a polysilicon gate is fully enclosed within silicon dioxide and is charged using tunneling current. Charge retention in flash memories has been measured in decades. The semiconductor process used to fabricate flash memory cells typically requires around 35 or more masking steps. By contrast, embodiments of the present invention can be fabricated using a single masking step: the step that defines the vertical posts of semiconductor material in one case, or the step that defines isolated metal pads in a second case. E-beam or other beam patterning is considered herein as a masking step. Flash memory cells also require switching transistors for addressing the rows and columns of a flash memory array. By contrast, embodiments of the present invention require no switching transistors and no active components to implement the charge storage array. In this regard, they are similar to a magnetic memory such as a hard disk. Reading a memory of the present invention may be accomplished using a flying read head, mechanically similar to flying read heads employed with magnetic memories. Without the need for switching transistors, a charge storage cell embodiment of the present invention can be substantially smaller than a flash memory cell for example. Since flash memories are fabricated on silicon chips and must have a high yield to be commercially successful, the die size of a flash memory chip is typically smaller than 1 cm×1 cm. By contrast, a memory array in accordance with embodiments of the present invention can measure 1 m×1 m, formed on either a rigid panel substrate or a flexible substrate. Finally, while a conventional flash memory chip requires materials like silicon that can withstand furnace temperatures of around 800-1200° C., a memory device using the teachings of the present invention can be fabricated at room temperature, or perhaps 150° C. above room temperature due to localized heating during processing. This means that such memory devices can be fabricated on flexible substrates, for example a polyimide substrate, and this can lead to novel electronic systems as one example.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A charge storage cell comprising:
an insulating substrate having a back side and a top side opposite the back side;
a back side conductive element coupled to the back side of the insulating substrate;
a top side metal pad coupled to the top side of the insulating substrate; and
an insulative layer covering the top side metal pad;
wherein the top side metal pad is operable to support an electric charge injected through the insulative layer by a charged particle beam.

2. The charge storage cell of claim 1 wherein the charge storage cell is substantially free of semiconductor materials.

3. The charge storage cell of claim 1 wherein the insulating substrate comprises a flexible substrate.

4. The charge storage cell of claim 1 wherein the insulating substrate comprises a rigid substrate.

5. The charge storage cell of claim 4 wherein the rigid substrate comprises glass.

6. The charge storage cell of claim 1 wherein the insulative layer comprises a material formed by physical vapor deposition.

7. The charge storage cell of claim 1 wherein the insulative layer comprises a material formed by chemical vapor deposition.

8. The charge storage cell of claim 1 wherein the insulative layer comprises a metal-oxide formed by oxidizing the metal of the top side metal pad.

9. The charge storage cell of claim 1 wherein the insulative layer comprises a complex functional metal-oxide formed by contact with a liquid chemical solution.

10. The charge storage cell of claim 1 wherein the injected electric charge is negative.

11. The charge storage cell of claim 1 wherein the injected electric charge is positive.

12. A charge storage cell comprising:
a conductive substrate;
a vertical post comprising a first insulating material coupled to the conductive substrate;
a conductive cap coupled to the vertical post; and
a top side planarizing layer comprising a second insulating material and covering the conductive cap;
wherein the conductive cap is operable to support an electric charge injected through the top side planarizing layer by a modulated charged particle beam.

13. The charge storage cell of claim 12 wherein the conductive substrate comprises a metal foil or the conductive cap comprises a metal cap.

14. The charge storage cell of claim 12 wherein the charge storage cell is substantially free of semiconductor materials.

15. The charge storage cell of claim 12 wherein the first insulating material and the second insulating material are a same material.

* * * * *